(12) United States Patent
Lin et al.

(10) Patent No.: US 10,830,836 B1
(45) Date of Patent: Nov. 10, 2020

(54) SYSTEMS AND METHODS FOR ANISOTROPIC VECTOR HYSTERESIS ANALYSIS

(71) Applicant: Ansys, Inc., Canonsburg, PA (US)

(72) Inventors: Dingsheng Lin, Venetia, PA (US); Ping Zhou, Bethel Park, PA (US); Yang Hu, Canonsburg, PA (US)

(73) Assignee: Ansys, Inc., Canonsburg, PA (US)

( * ) Notice: Subject to any disclaimer, the term of this patent is extended or adjusted under 35 U.S.C. 154(b) by 399 days.

(21) Appl. No.: 15/792,891

(22) Filed: Oct. 25, 2017

Related U.S. Application Data

(60) Provisional application No. 62/413,168, filed on Oct. 26, 2016.

(51) Int. Cl.
| | |
|---|---|
| *G01R 33/00* | (2006.01) |
| *G01R 33/12* | (2006.01) |
| *G01B 7/06* | (2006.01) |
| *G01N 27/82* | (2006.01) |

(52) U.S. Cl.
CPC ........... *G01R 33/0064* (2013.01); *G01B 7/10* (2013.01); *G01N 27/82* (2013.01); *G01R 33/1207* (2013.01); *G01R 33/1223* (2013.01)

(58) Field of Classification Search
CPC ............ G01R 33/0064; G01R 33/1215; G01R 33/1207; G01R 33/1223; G06F 2111/10; G06F 30/23; G01B 7/10; G01N 27/82
See application file for complete search history.

(56) References Cited

U.S. PATENT DOCUMENTS

2013/0006593 A1* 1/2013 Uehara ............ G01R 33/0064
703/2

* cited by examiner

*Primary Examiner* — Kyle R Quigley
(74) *Attorney, Agent, or Firm* — Jones Day

(57) ABSTRACT

Systems and methods are provided for analyzing magnetic hysteresis of anisotropic magnetic materials. Magnetic hysteresis loops associated with a local coordinate of a coordinated system based on a magnetic field successively applied to each principal axis with an isotropic vector play model are determined. A relaxation factor associated with the convergence behaviors of estimated solution points is applied along with a correction, either a magnetic field correction or a flux density correction, to determine target points on magnetic hysteresis loops. An error between magnetic hysteresis loops and the estimated solution points is determined. The iteration process continues up to a preset number of iterations with alternating correction schemes based on the determined error.

43 Claims, 36 Drawing Sheets

SYSTEMS AND METHODS FOR ANISOTROPIC VECTOR HYSTERESIS ANALYSIS

CROSS REFERENCE TO RELATED APPLICATIONS

This application claims priority to U.S. Patent Application No. 62/413,168, entitled "Systems and Methods for Anisotropic Vector Hysteresis Analysis," filed Oct. 26, 2016, the entirety of which is herein incorporated by reference. Additionally, this application is related to U.S. patent application Ser. No. 14/796,374, entitled "Systems and Methods for Vector Hysteresis Analysis," filed Jul. 10, 2015, the entirety of which is herein incorporated by reference.

TECHNICAL FIELD

The present disclosure relates generally to the field of computational simulations, and, more specifically, to processor-implemented systems and methods for finite element analysis.

BACKGROUND

The phenomenon of isotropic and anisotropic magnetic hysteresis has been observed in various magnetic materials which are used in electrical devices. To model the magnetic hysteresis behavior, a hysteresis model can be implemented in simulation software. The simplest form of a hysteresis model is in the scalar format. An isotropic vector hysteresis model can be extended from the scalar hysteresis model, which can be further extended to an anisotropic vector hysteresis model.

SUMMARY

In one aspect, a plurality of magnetic hysteresis loops associated with a local coordinate of a coordinate system based on a magnetic field successively applied to each principal axis of the anisotropic magnetic material can be determined. The coordinate system can be 2-Dimensional (2-D) or 3-Dimensional (3-D). A relaxation factor associated with the estimated solution points is applied along with a correction, either a magnetic field correction or a flux density correction, to generate target points on the plurality of magnetic hysteresis loops. The relaxation factor can be an under relaxation factor based on an unstable convergence behavior of the plurality of estimated solution points. In other variations, the relaxation factor can be an over relaxation factor for stable convergence behaviors of the plurality of estimated solution points.

An error between the magnetic hysteresis loops and estimated solution points is determined. The iteration process continues up to a preset number of iterations with alternating correction schemes based on the determined error.

In some variations, when the error is greater than an error threshold after the preset number of iterations, a second correction is applied to determine the plurality of target points on magnetic hysteresis loops. The second correction is different than the first correction. A second error between the magnetic hysteresis loops and the plurality of estimated solution points can be determined. The generation of the second corrected plurality of target points on magnetic hysteresis loops along with the error determination can be repeated until the second error is below the error threshold.

The plurality of magnetic hysteresis loops can be determined by applying an isotropic vector play model to each principal axis of the anisotropic magnetic material. A flux density can be determined as a function of the magnetic field as well as the magnetic field as a function of the flux density. A permeability tensor and intercept corresponding to the magnetic material can also be determined based on the target points on magnetic hysteresis loops.

In some variations, the flux density correction can be a minimum differential permeability. In other variations, the magnetic field correction can be a maximum differential permeability.

In another aspect, a system can include at least one data processor and memory storing instructions. Execution of the memory storing instructions by at least one data processor results in operations including determining a plurality of magnetic hysteresis loops associated with a local coordinate of a coordinate system based on a magnetic field successively applied to a principal axis of the anisotropic magnetic material. The coordinate system can be 2-D or 3-D. A relaxation factor associated with the estimated solution points is applied along with a correction, either a magnetic field correction or a flux density correction, to generate target points on magnetic hysteresis loops. The relaxation factor can be an under relaxation factor based on an unstable convergence behavior of the plurality of estimated solution points. In other variations, the relaxation factor can an over relaxation factor for stable convergence behaviors of the plurality of estimated solution points.

In yet another aspect, a non-transitory computer readable medium containing program instructions are executed by at least one data processor. Execution of the program instructions results in operations including determining a plurality of magnetic hysteresis loops associated with a local coordinate of a coordinate system based on a magnetic field successively applied to each principal axis of the anisotropic magnetic material. The coordinate system can be 2-D or 3-D. A relaxation factor associated with the estimated solution points is applied along with a correction, either a magnetic field correction or a flux density correction, to generate target points on magnetic hysteresis loops. The relaxation factor can be an under relaxation factor based on an unstable convergence behavior of the plurality of estimated solution points. In other variations, the relaxation factor can an over relaxation factor for stable convergence behaviors of the plurality of estimated solution points.

DETAILED DESCRIPTION

In general, an isotropic vector hysteresis model obeys the following properties, or basic rules: i) the saturation property—the magnetization should be limited to saturation for any magnetizing process; ii) the reduction property—the model should be able to reduce to the scalar model for an alternating field applied in any fixed direction if the media is originally demagnetized; iii) the rotational symmetry property—the locus of magnetization vector tip should trace out a circle for any rotating field; iv) the rotational loss property—the hysteresis loss should go to zero for large rotating fields.

For an anisotropic vector hysteresis model, two additional properties can be satisfied: i) an anisotropic vector hysteresis model should be able to degenerate to an isotropic vector hysteresis model when input magnetic properties in various directions are the same; ii) an anisotropic vector hysteresis model should be able to reduce to the scalar model for alternating field applied in any principal axis.

In addition, for a practical vector hysteresis model, parameters used in the model should be able to be identified based on available measured data. For practical applications, measured data can be available from the manufacture of the magnetic material.

To predict the magnetization behavior for hysteresis magnetic materials in 2D or 3D transient finite element analysis (FEA), a vector play model can be applied. An anisotropic vector play model can be generated by multiplying a matrix to the field vector output from the isotropic vector play model. The isotropic vector play model can be identified from the averaged alternating property measured with alternating flux density of various amplitudes applied at different azimuth angles, and the diagonal matrix can be determined to reconstruct the anisotropic alternating property approximately from the averaged alternating property. In order to identify this anisotropic vector play model, the alternating properties with various amplitudes of alternating flux density applied at different azimuth angles, as well as the rotational hysteresis losses with various amplitudes of rotating flux density, can be measured. The systems and methods as described herein are related to improvements in computer capabilities (e.g., increased data processing by one or more data processors based on reducing computational analysis of simulated physical systems). For example, the systems and methods as described herein can minimize the amount of input data required for a simulation to determine an error associated with a physical system being designed and/or modeled.

A. Scalar Play Model

The output of the scalar play model is given by:

$$m(t) = \sum_{k=1}^{n} f_k(h_{rek}(t)) \quad (1)$$

where $f_k(\cdot)$'s correspond to one or more anhysteretic nonlinear functions. The scalar model implements a scalar play operator $h_{rek}$ given by:

$$h_{rek}(t) = P_{\sigma_k}[h_k(t)] \quad (2)$$

Figure 1:
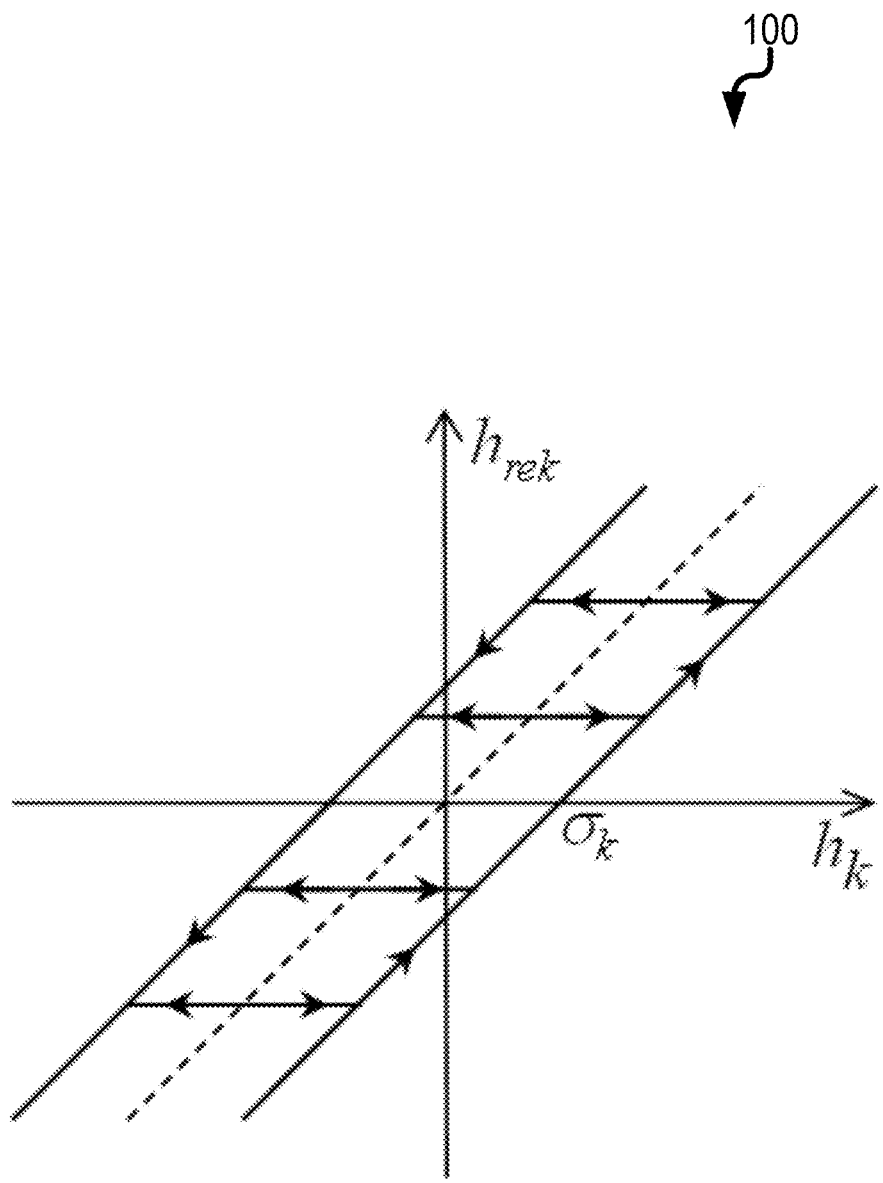
FIG. 1 depicts an example diagram showing a scalar play operator.

The scalar play operator $h_{rek}$ is shown in plot 100 FIG. 1. The input of the scalar play model includes an applied field intensity $h_k$ given by:

$$h_k(t) = h(t) \quad k=1,2,\ldots,n \tag{3}$$

One or more returned values of the scalar play operator are bounded within two parallel limit lines (e.g., an ascending limit line and a descending limit line), as shown in FIG. 1. A flux density b(t) is obtained as follows:

$$b(t) = \mu_0(m(t) + h(t)) = \sum_{k=1}^{n} b_k(t) \tag{4}$$

where $$\begin{aligned} b_k(t) &= \mu_0(f_k(h_{rek}(t)) + h(t)) \\ &= b_{rek}(t) + \mu_0(h_k(t) - h_{rek}(t)) \end{aligned} \tag{5}$$

with $$b_{rek}(t) = \mu_0(f_k(h_{rek}(t)) + h_{rek}(t)) \tag{6}$$

Figure 2:
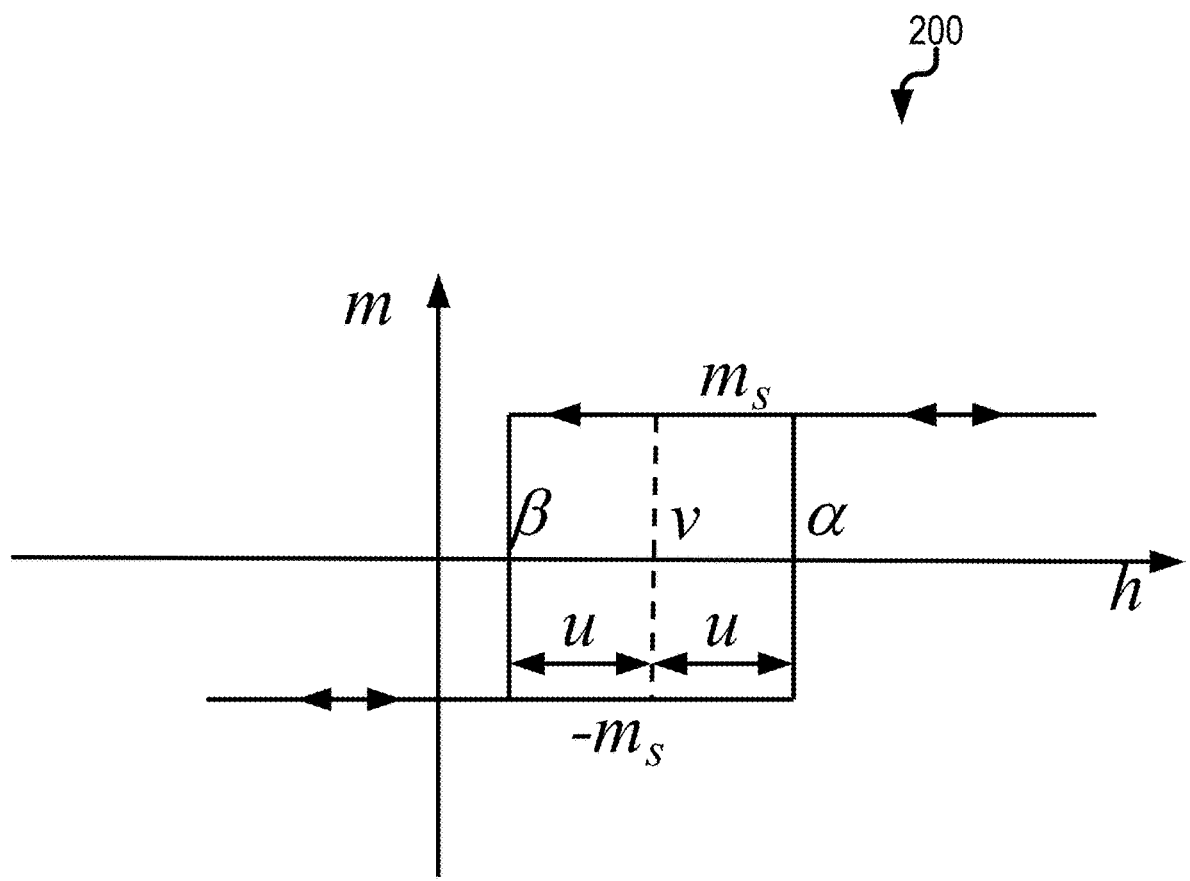
FIG. 2 depicts a Preisach hysteron.

The 2-dimensional integration in ($\alpha$, $\beta$) can be transferred to and integrated in (u, v) domain, where ($\alpha$, $\beta$) and (u, v) are the parameters of a Preisach hysteron defined in two different ways, as shown in FIG. 2.

A play hysteron can be defined as the integration of Preisach hysterons with the same irreversible field components, u parameters, for different reversible field components, v parameters. The play operator of the play hysteron with u=$\sigma_k$ as shown in FIG. 1, where the dashed line represents the integration range of the reversible components v.

Figure 3:
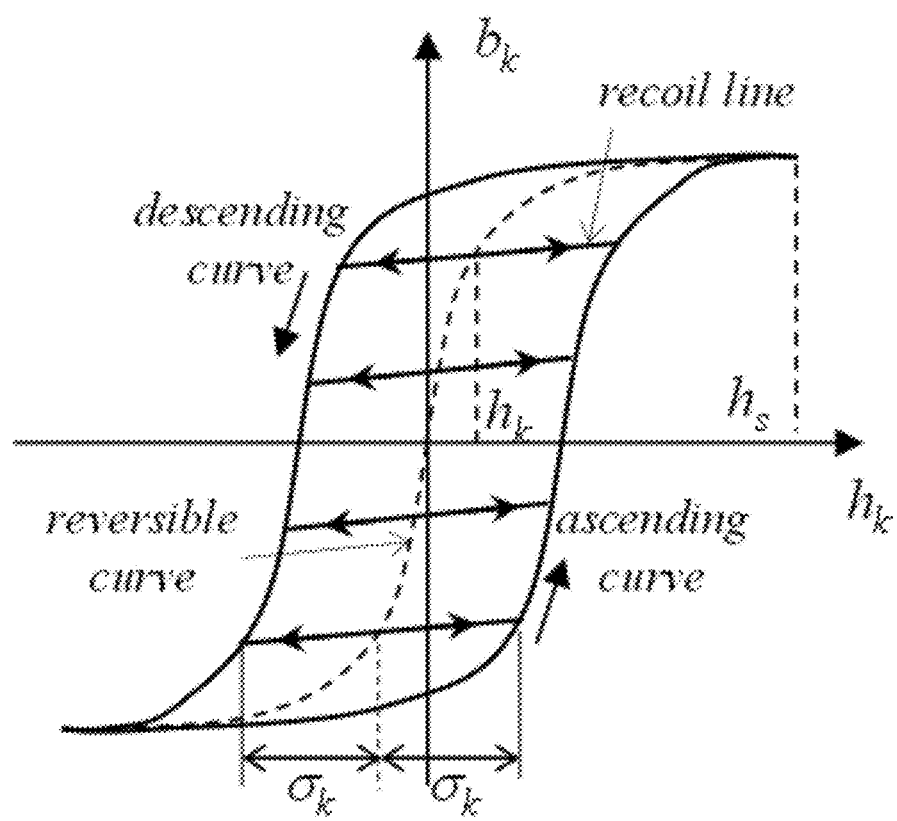
FIG. 3 depicts an example diagram showing a b-h curve of a play hysteron.
Figure 4:
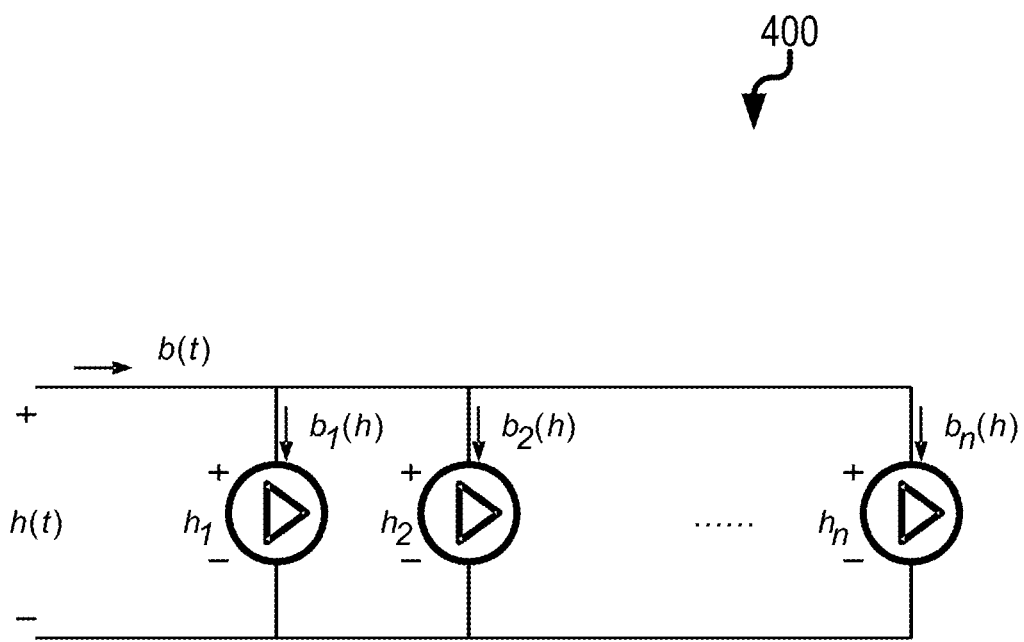
FIG. 4 depicts an example diagram showing a parallel-connected circuit for scalar play hysterons.

The flux density $b_k(t)$ of a play hysteron is shown in plot 300 FIG. 3. When the applied field $h_k(t)$ increases, $b_k(t)$ tracks the ascending curve. If $h_k(t)$ decreases, $b_k(t)$ tracks a recoil line first, then tracks the descending curve. All recoil lines have a same slope of $\mu_0$. The output b(t) can be seen as the total contribution of n play hysterons. If each hysteron is represented by a circuit element with h denoting a "cross" quantity and b a "through" quantity, Equation (3) may be expressed by a parallel-connected circuit 400, as shown in FIG. 4. If the applied field $h_k$ is decomposed into two components—a reversible component and an irreversible component, then the scalar play operator $h_{rek}$ represents the reversible component, and $h_k - h_{rek}$ stands for the irreversible component $h_{irk}$ which satisfies:

$$|h_k - h_{rek}| \le \sigma_k \tag{7}$$

where $\sigma_k$ represents an intrinsic coercivity for a k-th play hysteron.

The parameters of the scalar play model to be identified include one or more anhysteretic curves $f_k(\cdot)$, k=1, 2, ..., n, which are identified by letting the curves derived from the scalar play model best match the measured ones. In order to identify all these anhysteretic curves, a prohibitive experimental effort is often needed, and the identification process may also be quite complicated.

B. Isotropic Ordinary Vector Play Model

In some embodiments, the scalar play operator $h_{rek}$ as shown in FIG. 1 is expressed as:

$$h_{rek} \max(\min(h_{rek0}, h_k + \sigma_k), h_k - \sigma_k) \tag{8}$$

or $$h_{rek} = h_k - \frac{\sigma_k(h_k - h_{rek0})}{\max(\sigma_k, |h_k - h_{rek0}|)} \tag{9}$$

where $h_{rek0}$ represents an initial value of $h_{rek}$.

The scalar play operator $h_{rek}$ expressed in Equation (9) is extended for a vector field, where vectors are annotated through the use of bold lettering, as:

$$\mathbf{h}_{rek} = \mathbf{h}_k - \frac{\sigma_k(\mathbf{h}_k - \mathbf{h}_{rek0})}{\max(\sigma_k, |\mathbf{h}_k - \mathbf{h}_{rek0}|)} \tag{10}$$

or $$\mathbf{h}_{rek} = \begin{cases} \mathbf{h}_{rek0} & \text{if } |\mathbf{h}_k - \mathbf{h}_{rek0}| < \sigma_k \\ \mathbf{h}_k - \sigma_k \cdot \dfrac{\mathbf{h}_k - \mathbf{h}_{rek0}}{|\mathbf{h}_k - \mathbf{h}_{rek0}|} & \text{if } |\mathbf{h}_k - \mathbf{h}_{rek0}| \ge \sigma_k \end{cases} \tag{11}$$

Figure 5:
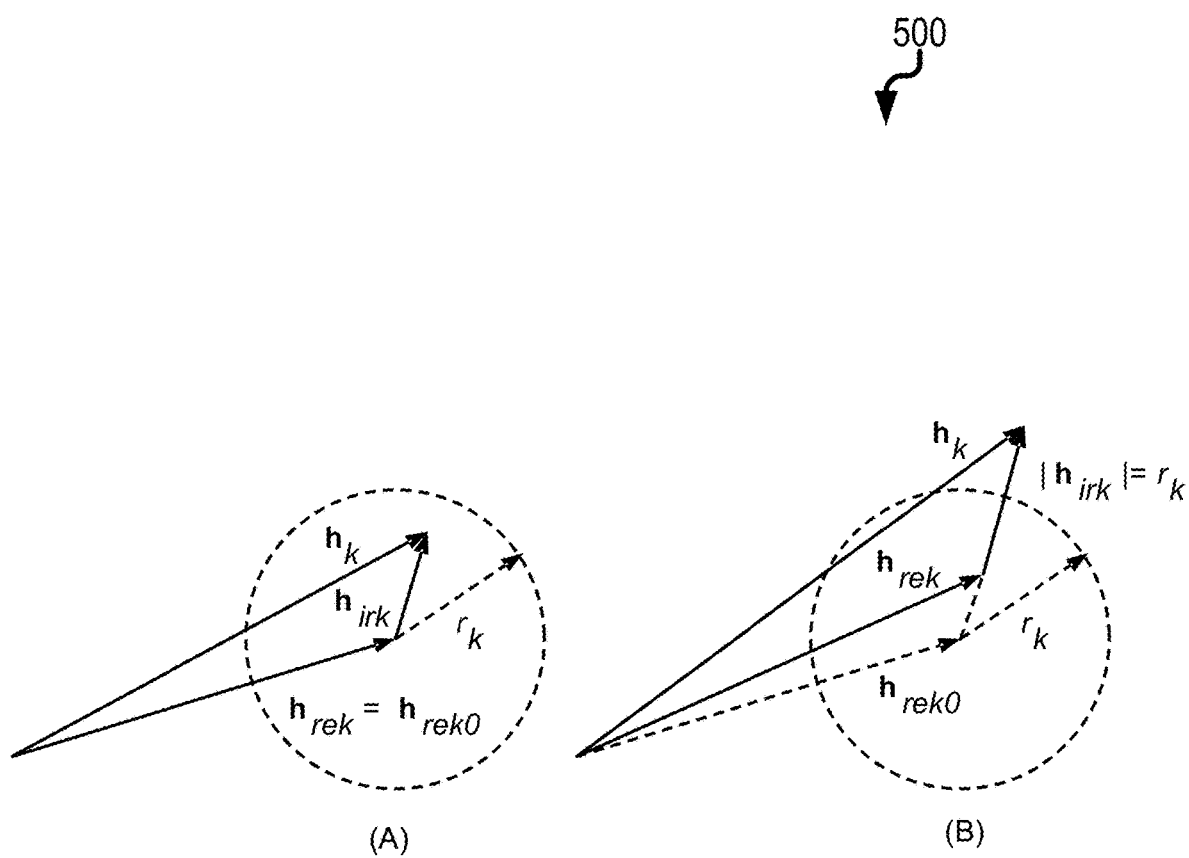
FIG. 5 depicts an example diagram showing an ordinary vector play operator.

The ordinary vector play operator $\mathbf{h}_{rek}$ is illustrated by a vector diagram 500 as shown in FIG. 5. A circle can be drawn at the tip of the vector $\mathbf{h}_{rek0}$ with a radius $r_k = \sigma_k$. If the tip of the applied field $\mathbf{h}_k$ falls inside the circle, a reversible component $\mathbf{h}_{rek}$ is kept unchanged (e.g., equal to an initial vector $\mathbf{h}_{rek0}$), as shown in FIG. 5(A). On the other hand, if the tip of the applied field $\mathbf{h}_k$ falls outside the circle, an irreversible component $\mathbf{h}_{irk}$ is set in the direction of $\mathbf{h}_k - \mathbf{h}_{rek0}$ with a length of $r_k$, and then the reversible component $\mathbf{h}_{rek}$ is set as $\mathbf{h}_{rek} = \mathbf{h}_k - \mathbf{h}_{irk}$, as shown in FIG. 5(B). Parameters for the ordinary vector play model associated with FIG. 5 are the same as those for the scalar play model described above, and therefore can be identified based on the scalar play model.

As shown in FIG. 5, if the applied field $\mathbf{h}_k$ rotates, at a steady state, the irreversible component $\mathbf{h}_{irk}$ is perpendicular to the reversible component $\mathbf{h}_{rek}$. As an example, in the ordinary vector play operator as shown in FIG. 5, the magnitude of $\mathbf{h}_{irk}$ is constant no matter how large the applied field $\mathbf{h}_k$ is, which means $\mathbf{m}_k$, in the same direction of $\mathbf{h}_{rek}$, lags $\mathbf{h}_k$ a certain angle. The ordinary vector play model described above may not satisfy the rotational loss property that the magnetic hysteresis loss of any applied rotating magnetic field approaches zero when the magnitude of the applied rotating magnetic field becomes saturated.

C. Specific Vector Play Operator

In order to satisfy the rotational loss property for any vector play hysteron, the irreversible field component may need to be zero when the applied field is beyond a saturation field $h_s$. The vector hysteresis analysis system determines a specific vector play operator $\mathbf{h}_{rek}$ as:

$$\mathbf{h}_{rek} = \begin{cases} \mathbf{h}_{rek0} & \text{if } |\mathbf{h}_k - \mathbf{h}_{rek0}| < r_k(\mathbf{h}_{rek}) \\ \mathbf{h}_k - r_k(\mathbf{h}_{rek}) \cdot \dfrac{\mathbf{h}_k - \mathbf{h}_{rek0}}{|\mathbf{h}_k - \mathbf{h}_{rek0}|} & \text{if } |\mathbf{h}_k - \mathbf{h}_{rek0}| \ge r_k(\mathbf{h}_{rek}) \end{cases} \tag{12}$$

where $$r_k(\mathbf{h}_{rek}) = \begin{cases} \sigma_k & \text{if } |\mathbf{h}_{rek}| \le (h_s - \sigma_k) \\ h_s - |\mathbf{h}_{rek}| & \text{if } (h_s - \sigma_k) < |\mathbf{h}_{rek}| \le h_s \\ 0 & \text{if } |\mathbf{h}_{rek}| > h_s \end{cases} \tag{13}$$

Figure 6:
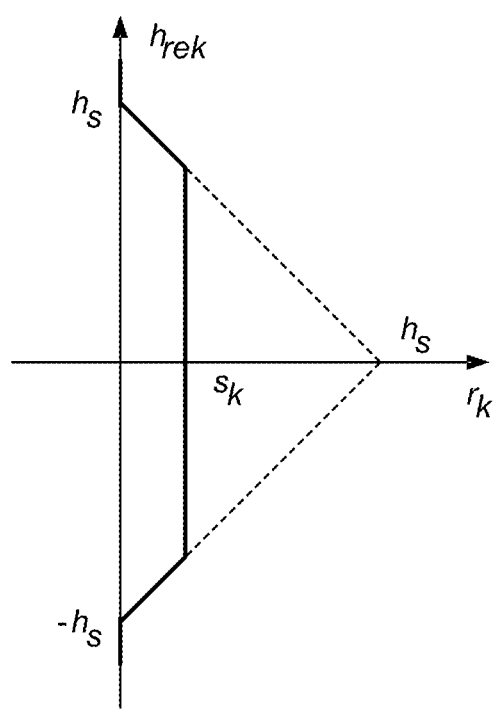
FIG. 6 depicts an example diagram showing an irreversible component as a function of a reversible component.

$r_k(h_{rek})$ is shown in plot 600 of FIG. 6. The specific vector play operator $h_{rek}$ (e.g., considering the saturation behavior) is shown in plot 700 of FIG. 7.

D. Variable Slope for Recoil Lines

Referring back to FIG. 3, for the scalar play operator (or the ordinary vector play operator), all recoil lines inside the hysteresis loop have the same slope of $\mu_0$, which may cause the area of a minor hysteresis loop bounded within a major hysteresis loop and two parallel recoil lines to be larger than a measured one. In order to more accurately represent individual minor loop behavior, the vector hysteresis analysis system introduces a variable slope algorithm so that the area of a derived minor loop can best match the area of a measured minor loop.

Figure 8:
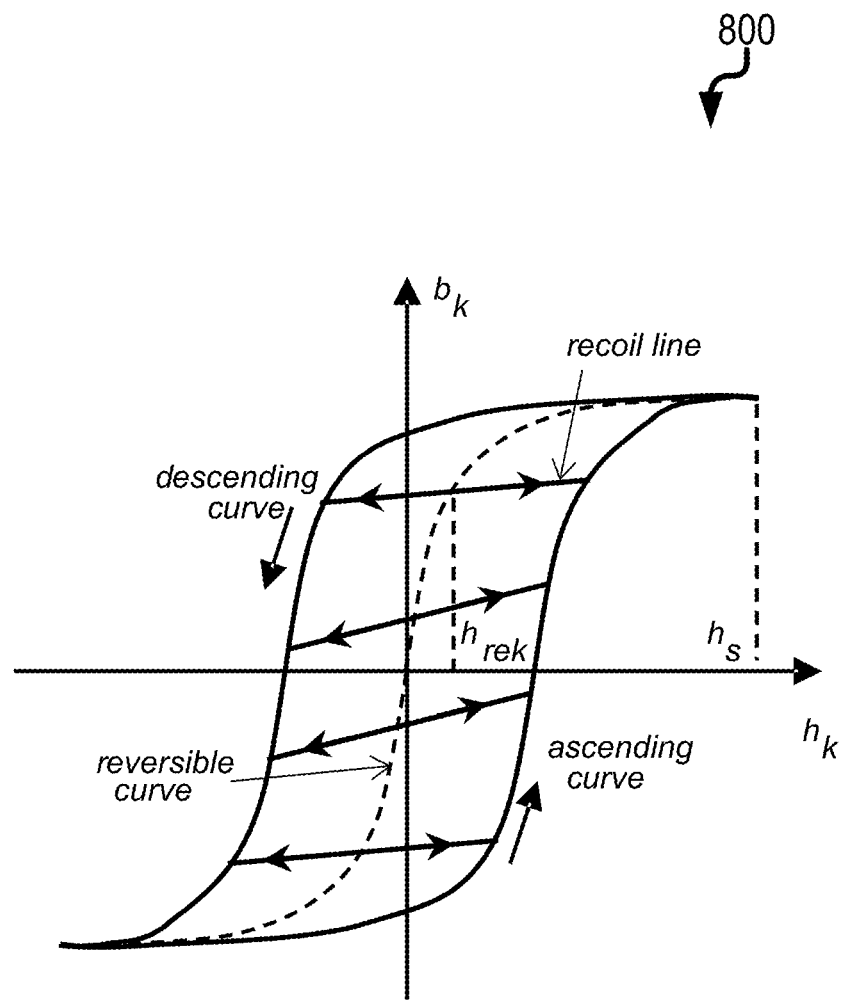
FIG. 8 depicts an example diagram showing recoil lines with variable slopes.

Particularly, the hysteresis analysis system constructs a slope of a recoil line as a linear function of a slope of a tangent line of a reversible curve at an intersection with the recoil line, as shown in plot 800 of FIG. 8. For example, assuming that a recoil line intersects the reversible curve at $h_{rek}$, the slope of the tangent line is given by:

$$\tilde{\mu} = \frac{df_k(h)}{dh}\bigg|_{h=h_{rek}} = \tilde{\mu}_r \mu_0 \quad (14)$$

The slope of the recoil line is given by:

$$\mu = k_\mu(\tilde{\mu} - \mu_0) + \mu_0 = (k_\mu(\tilde{\mu}_r - 1) + 1)\mu_0 \quad (15)$$

where $k_\mu$ represents a parameter to be identified. When $k_\mu = 0$, the slope of all recoil lines becomes constant, the vector hysteresis model determined by the hysteresis analysis system degrades to the ordinary vector play model associated with FIG. 3. Accordingly, $r_k$ is modified as:

$$r_k(h_{rek}) = \begin{cases} \frac{1}{1-k_\mu}\sigma_k & \text{if } |h_{rek}| \leq (h_s - \sigma_k) \\ \frac{1}{1-k_\mu}(h_s - |h_{rek}|) & \text{if } (h_s - \sigma_k) < |h_{rek}| \leq h_s \\ 0 & \text{if } |h_{rek}| > h_s \end{cases} \quad (16)$$

Figure 9:
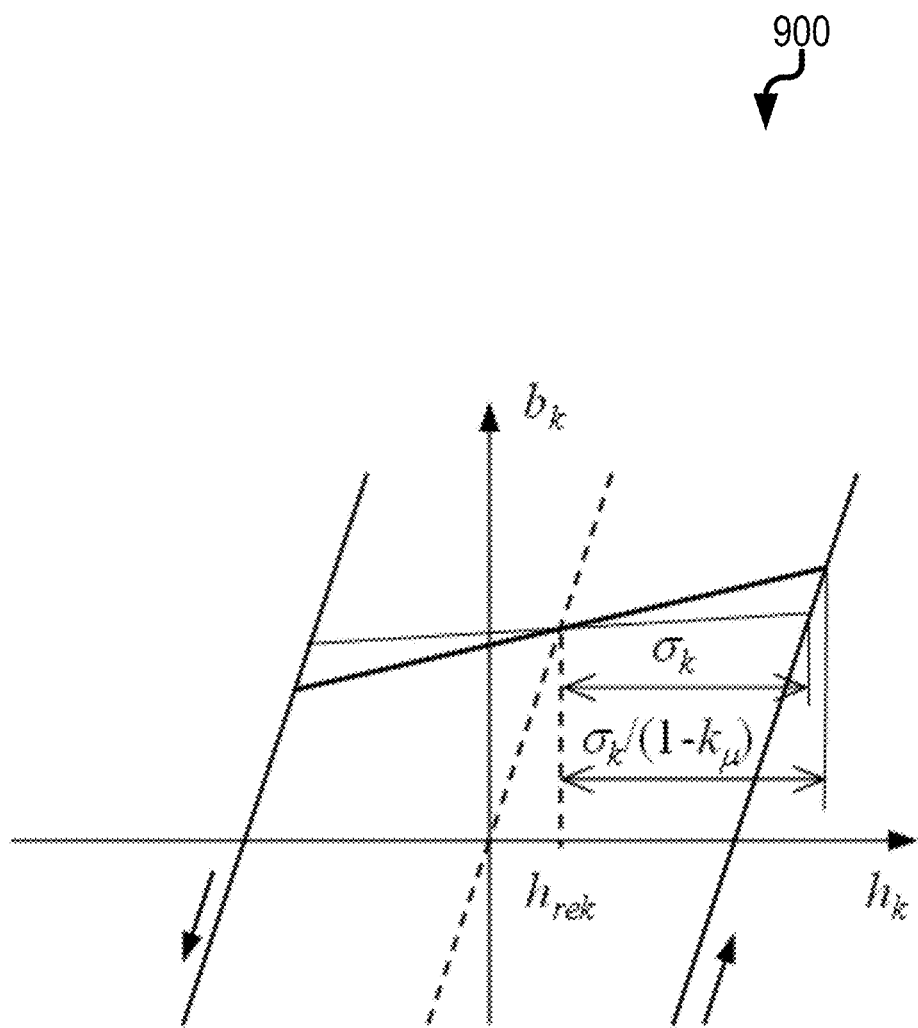
FIG. 9 depicts an example diagram showing irreversible limit modified based on recoil line slopes.

The modified $r_k(h_{rek})$ is shown in plot 900 of FIG. 9.

After $h_{rek}$ is determined by the specific vector play operator (e.g., as determined by Equation (12)), a reversible flux density $b_{rek}$ is computed from Equation (6) with the direction of $h_{rek}$. The flux density is given by:

$$b_k(t) = b_{rek}(t) + \mu r(h_{rek})(h_k(t) - h_{rek}(t)) \quad (17)$$

E. Improved Isotropic Vector Play Model

Figure 10:
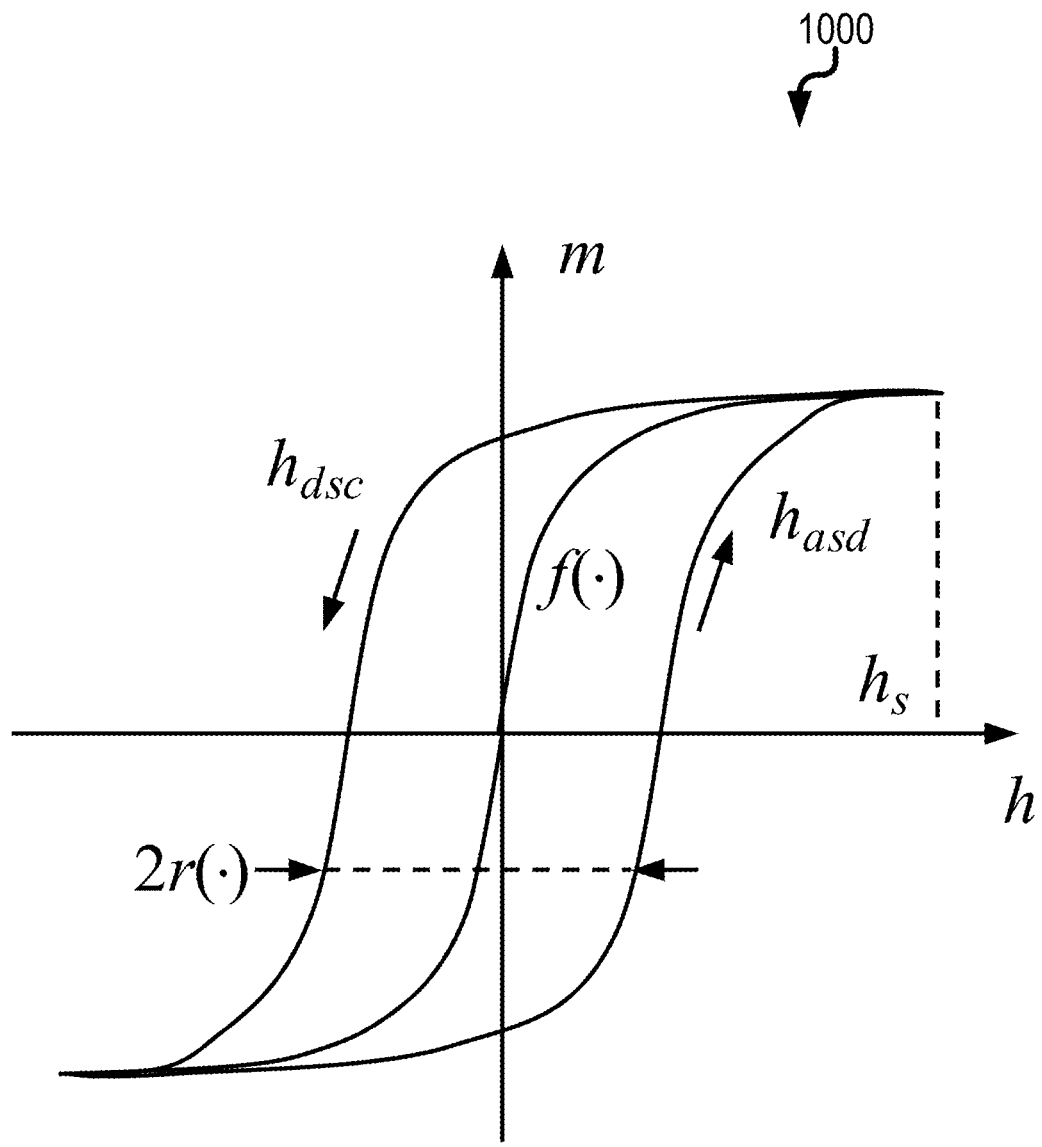
FIG. 10 depicts an example plot showing a b-h loop of a play hysteron.

The b-h loop of one play hysteron, as shown in FIG. 3, can represent the resultant b-h of all play hysteron with reasonable accuracy. The ordinary vector play model does not obey the rotational loss property that the magnetic hysteresis loss of any applied rotating magnetic field tends to zero when the magnitude of the applied rotating magnetic field becomes saturated. In order to satisfy the rotational loss property for any vector play hysteron, the irreversible field component can be set to zero when the applied field which is beyond the saturation field $h_s$. The vector play model of Equation (12) can output of a vector play model of:

$$\begin{cases} m = f(h_{re}) \cdot \dfrac{h_{re}}{h_{re}} \\ b = \mu_0(m + h) \end{cases} \quad (18)$$

where shape function $f(\cdot)$ can be identified from the center curve of the ascending and descending branches of the measured m-h hysteresis loop and $r(\cdot)$ can be identified from the half width of the ascending and descending branches, as shown in plot 1000 of FIG. 10.

F. Local Iteration Algorithm

The vector hysteresis analysis system introduces a local iteration algorithm, which allows either deriving the applied magnetic field $h_k$ from the flux density $b_k$ or deriving the flux density $b_k$ from the applied magnetic field $h_k$, for numerical stability that is considered as one of the most challenging issues for practical applications. For example, the vector hysteresis analysis system introduces the local iteration algorithm to efficiently locate an operating point on hysteresis loops in addition to a global iteration algorithm (e.g., a Newton-Raphson global nonlinear iteration algorithm). Specifically, Equation (12) is solved to derive $h_{rek}$ from $h_k$. Since $r_k$ in Equation (16) depends on $h_{rek}$, a local iterating process is performed.

In some embodiments, the vector hysteresis analysis system derives the flux density $b_k$ from the applied magnetic field $h_k$. When the applied field $h_k$ locates inside the circle as shown in FIG. 5(A), $h_{rek}$ is kept the same as the initial value $h_{rek0}$. On the other hand, when the applied field $h_k$ locates outside the circle as shown in FIG. 5(B), $h_{rek}$ is derived according to the following iteration process: 1) Assume $h_{rek} = h_{rek0}$; 2) Obtain $h_{irk}$ from $r_k$ by Equation (16) and the direction of $(h_k - h_{rek0})$; 3) Calculate $\Delta h = h_k - (h_{rek} + h_{irk})$; 4) Let $h_{rek} = h_{rek} + \alpha \Delta h$; 5) Repeat operations 2)-4) until $|\Delta h|/h_s < \varepsilon$.

In the iterating process, $\alpha$ represents a relaxation factor which can be optimized based on the historic iterating results, and $\varepsilon$ represents a given tolerance. After $h_{rek}$ is obtained, $b_k$ is computed according to Equation (17) and Equation (6).

Figure 11:
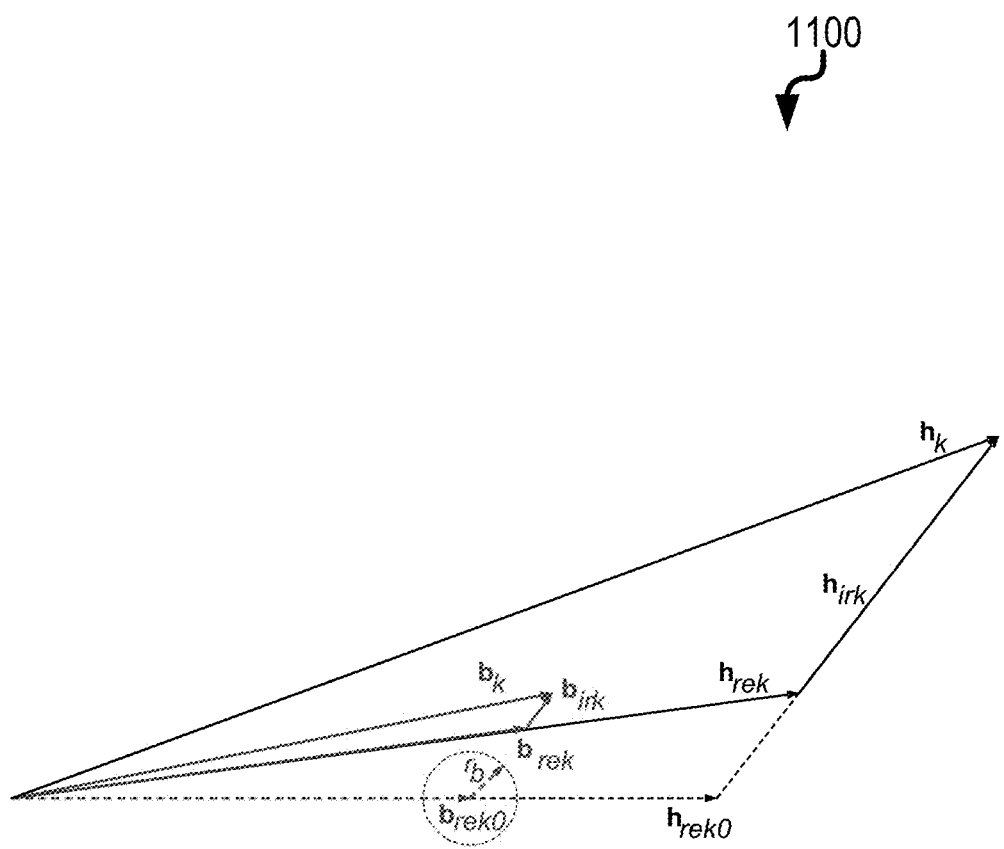
FIG. 11 depicts an example diagram showing a vector diagram for deriving a magnetic field from a flux density.

In certain embodiments, the vector hysteresis analysis system derives the applied magnetic field $h_k$ from the flux density $b_k$. That is, Equation (12) is solved inversely. A vector $b_{rek0}$ and $\mu$ are obtained from $h_{rek0}$, and a circle is drawn at the tip of the vector $b_{rek0}$ with a radius of $r_b = \mu r_k(h_{rek0})$, as shown in diagram 1100 of FIG. 11. When the tip of the vector $b_k$ locates inside the circle, $h_{rek}$ is kept the same as the initial value $h_{rek0}$. On the other hand, when the tip of the vector $b_k$ locates outside the circle as shown in FIG. 11, another iteration process is performed: 1) Assume $b_{rek} = b_k$; 2) Obtain $h_{rek}$ from $b_{rek}$ based on a reversible b-h curve according to Equation (6); 3) Obtain $\mu$ from $h_{rek}$ based on Equation (15); 4) Obtain $h_{irk}$ from $r_k$ by Equation (16) and the direction of $(h_{rek} - h_{rek0})$; 5) Let $b_{irk} = \mu h_{irk}$; 6) Calculate $\Delta b = b_k - (b_{rek} + b_{irk})$; 7) Let $b_{rek} = b_{rek} + \alpha \Delta b$; 8) Repeat operations 2)-7) until $|\Delta b|/b_s < \varepsilon$, where $b_s$ represents the flux density at $h_s$.

After $h_{rek}$ is obtained, $h_k$ is computed as follows:

$$h_k(b_k) = h_{rek} + (b_k - b_{rek})/\mu \quad (19)$$

G. Series-Distributed Model

Figure 7:
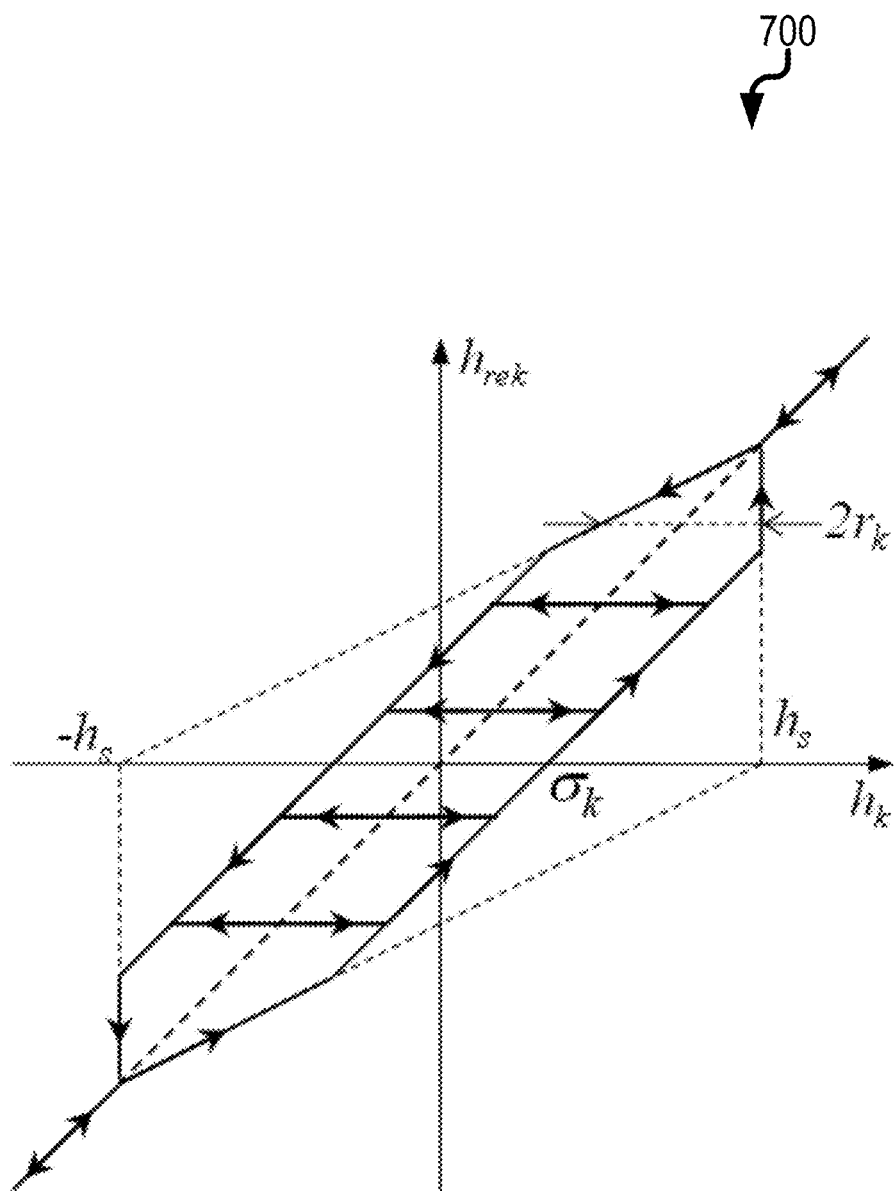
FIG. 7 depicts an example diagram showing a specific vector play operator.

Furthermore, the vector hysteresis analysis system 3404 generates a series-distributed hysteron model for analyzing magnetic materials (e.g., predicting magnetization behavior of the magnetic materials). Particularly, to satisfy the rotational loss property, the b-h hysteresis loop associated with the specific play operator is discontinued at $h = \pm h_s$ for each play hysteron, as shown in FIG. 7. The series-distributed hysteron model based on series-distributed play hysterons accommodates the specific vector play operator and the variable slope algorithm described above so as to reduce any possible discontinuity. For example, the series-distributed play model is used according to the variable slope algorithm for recoil lines and the local iteration algorithm for deriving $h_k$ from $b_k$ for each play hysteron.

Figure 12:
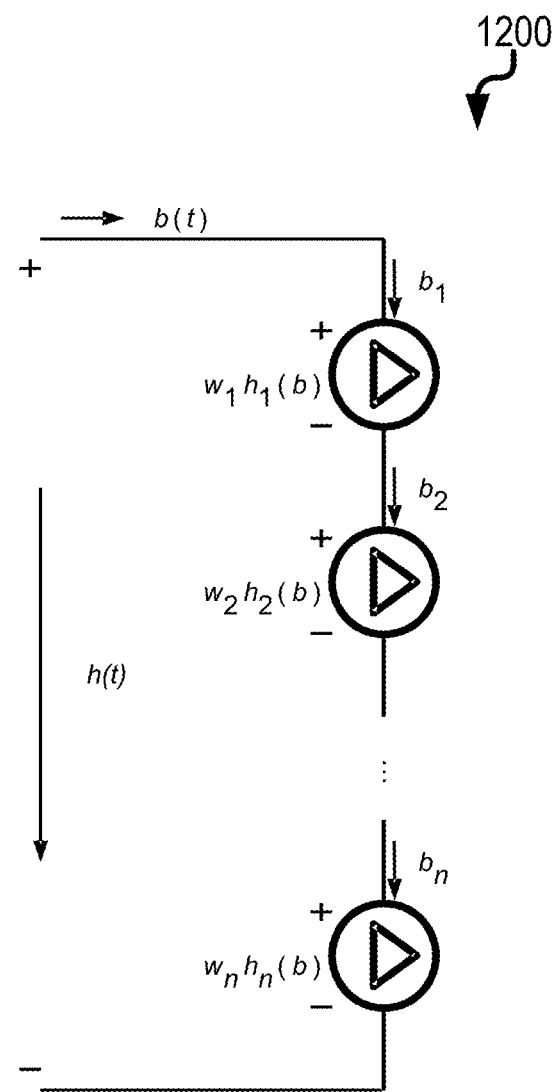
FIG. 12 depicts an example diagram showing a series-connected circuit for play hysterons.
Figure 13:
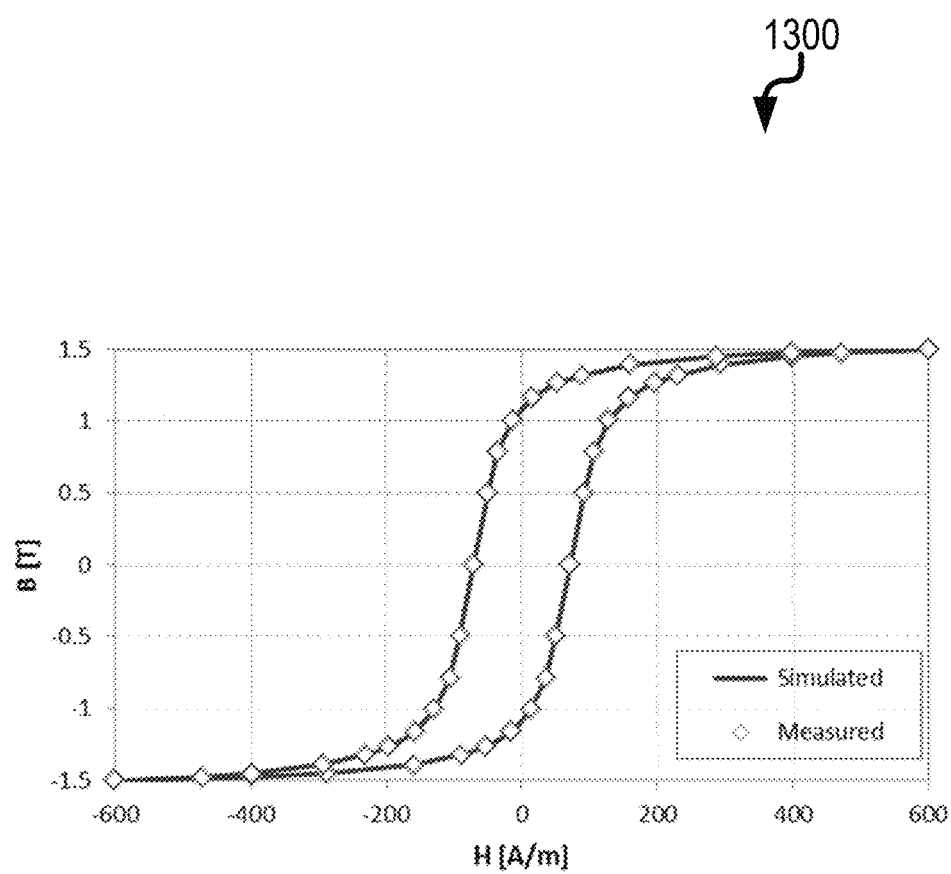
FIG. 13 depicts an example diagram showing a comparison between simulated results derived from the vector hysteresis model and measured data.
Figure 14:
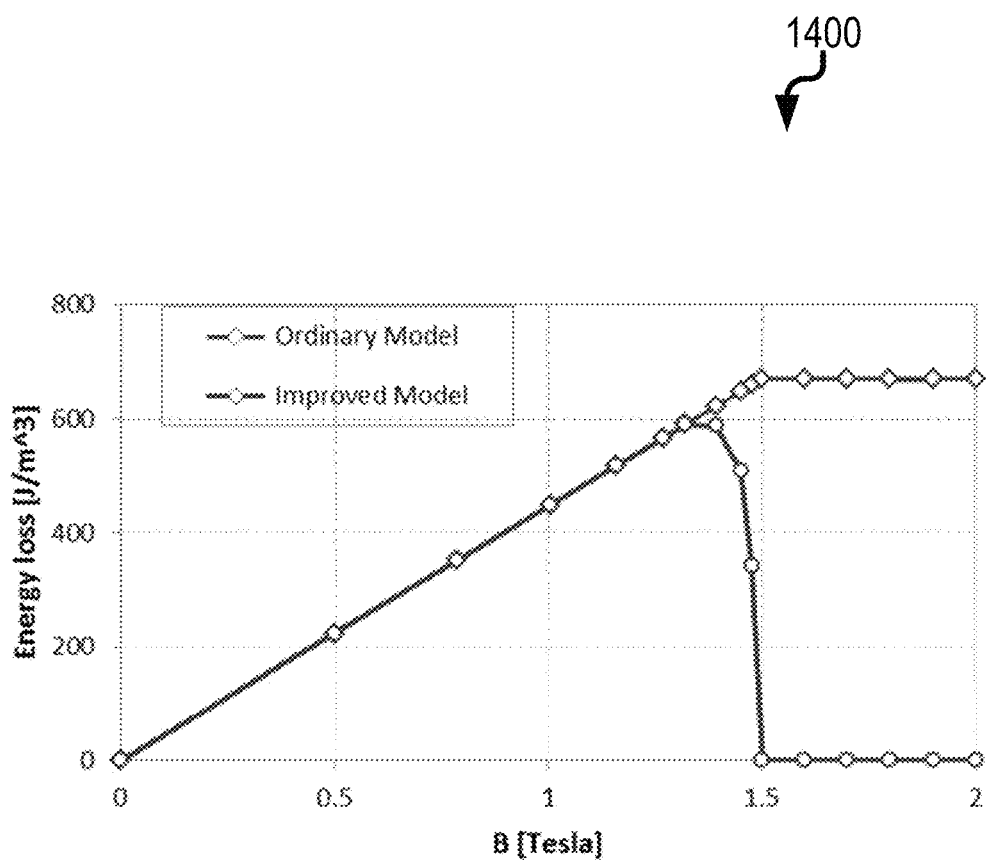
FIG. 14 depicts an example diagram showing a comparison between simulated results of rotational losses derived from the vector hysteresis model and simulated results derived from the ordinary vector play model.

In Equation (19), the applied field $h_k$ is expressed as a function of the flux density $b_k$ for the k-th play hysteron. For series connection, $b_1=b_2=\ldots=b_n=b$, and thus, the total applied field for the series-distributed play hysterons can be expressed as follows:

$$h(t) = \sum_{k=1}^{n} w_k h_k(b) \tag{20}$$

where the parameters $w_k$ represent weighting factors for all play hysterons. The series-connected circuit 1200 is shown in FIG. 12. FIG. 13 depicts an example diagram 1300 showing a comparison between simulated results derived from the vector hysteresis model and measured data. FIG. 14 depicts an example diagram 1400 showing a comparison between simulated results of rotational losses derived from the vector hysteresis model and simulated results derived from the ordinary vector play model.

H. Parameter Identification

With the introduction of the series-distributed model, all play hysterons can have a same reversible nonlinear b-h curve. As a result, a parameter identification process, as an integral function of the vector hysteresis analysis system 3404, may be simplified. In some embodiments, the vector hysteresis analysis system 3404 performs parameter identification for the series-distributed hysteron model (e.g., based on available measured data). For example, the measured data are directly available from the manufacture of the magnetic materials. In some embodiments, all play hysterons associated with the series-distributed model can have a same reversible nonlinear b-h curve so that the parameter identification process is greatly simplified.

The parameters of the vector hysteresis model include: i) a reversible nonlinear b-h curve for all play hysterons; ii) a coefficient $k_\mu$ for variable slope of recoil lines; iii) a weighting factor for each play hysteron. These parameters can be identified based on a normal b-h curve and a major hysteresis loop.

The reversible nonlinear b-h curve is obtained from a reversible nonlinear m-h curve which can in turn be derived from a center line of an m-h major hysteresis loop. The major hysteresis loop includes an ascending curve $m_{asd}(h)$ and a descending curve $m_{dsc}(h)$. The ascending curve, or the descending curve can be directly obtained from each other based on the odd symmetry condition. Only one curve is needed from input, according to some embodiments.

Figure 15:
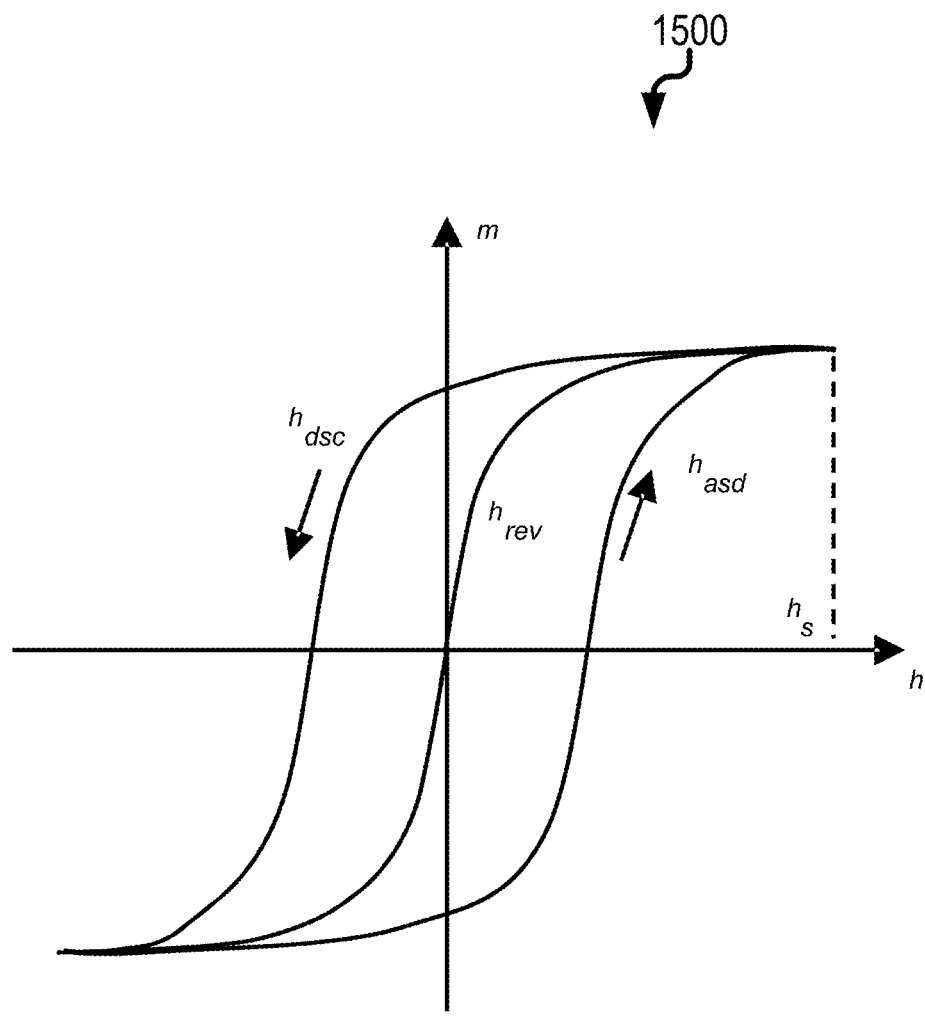
FIG. 15 depicts an example diagram showing a reversible nonlinear m-h curve identified from ascending and descending curves.

In certain embodiments, the inverse functions of $m_{asd}(h)$ and $m_{dsc}(h)$ are denoted as $h_{asd}(m)$ and $h_{dsc}(m)$, respectively, as shown in plot 1500 of FIG. 15. The reversible nonlinear m-h curve is determined from:

$$h_{rev}(m) = (h_{asd}(m) + h_{dsc}(m))/2 \tag{21}$$

If the inverse function of $h_{rev}(m)$ is expressed as $m_{rev}(h)$, then the reversible nonlinear b-h curve can be obtained from:

$$b_{rev}(h) = \mu_0(m_{rev}(h) + h) \tag{22}$$

After the reversible nonlinear b-h curve is derived, the remaining parameters can be determined by making a simulated normal b-h curve and a derived ascending curve of the major hysteresis loop best match to the input normal b-h curve and the input ascending curve of the major hysteresis loop respectively.

If $h_{rek0}$ starts from 0 and b sweeps from 0 to $b_s$, the derived normal b-h curve is derived based on the local iteration algorithm for deriving $h_k$ from $b_k$ with $b_k=b$ for all hysterons. If a sweep index is denoted as i, for a given value of $k_\mu$, $h_{ki}$ is obtained from $b_i$, and a total field $h_i$ of all play hysterons is determined as follows:

$$h_i = \sum_{k=1}^{n} w_k h_{ki} \tag{23}$$

If a field on the input normal b-h curve at $b_i$ is denoted as $h_i'$, then a total error between the derived b-h curve and the input normal b-h curve for all sweepings is determined as follows:

$$e_{nor} = \sum_{i=1}^{m_1} \left( \sum_{k=1}^{n} w_k h_{ki} - h_i' \right)^2 \tag{24}$$

where $m_1$ represents the number of sweeps for the normal b-h curve.

Similarly, if $h_{rek0}$ starts from $-h_s$ and b sweeps from $-b_s$ to $b_s$, the field on the derived ascending curve is obtained from the vector hysteresis model. If an index for the ascending curve sweep is counted from $m_1+1$ to $m=m_1+m_2$, the error between the derived ascending curve and the input ascending curve for all sweepings is determined as follows:

$$e_{asd} = \sum_{i=m_1+1}^{m} \left( \sum_{k=1}^{n} w_k h_{ki} - h_i' \right)^2 \tag{25}$$

where $m_2$ represents the number of sweeps for the ascending curve.

To minimize the total error, that is, let $$\frac{\partial}{\partial w_j}(e_{nor} + e_{asd}) = 0 \quad j = 1, 2, \ldots, n \tag{26}$$

The following equation is obtained:

$$\sum_{i=1}^{m} \left( \sum_{k=1}^{n} w_k h_{ki} - h_i' \right) h_{ji} = 0 \quad j = 1, 2, \ldots, n \tag{27}$$

Or the following equation is obtained:

$$\begin{bmatrix} a_{11} & a_{12} & \cdots & a_{1n} \\ a_{21} & a_{22} & \cdots & a_{2n} \\ \vdots & \vdots & a_{kj} & \vdots \\ a_{n1} & a_{n2} & \cdots & a_{nn} \end{bmatrix} \cdot \begin{bmatrix} w_1 \\ w_2 \\ \vdots \\ w_n \end{bmatrix} = \begin{bmatrix} y_1 \\ y_2 \\ \vdots \\ y_n \end{bmatrix} \tag{28}$$

where $$a_{kj} = \sum_{i=1}^{m}(h_{ki}h_{ji}) \ k=1,2,\ldots,n; \ j=1,2,\ldots,n \quad (29)$$

and $$y_j = \sum_{i=1}^{m}(h'_i h_{ji}) j = 1, 2, \ldots, n \quad (30)$$

After $w_k$ is solved from Equation (28), the total error, as a function of $k_\mu$, is obtained from:

$$err(k_\mu) = \sum_{i=1}^{m}\left(\sum_{k=1}^{n} w_k h_{ki} - h'_i\right)^2 \quad (31)$$

For example, an optimal $k_\mu$ can be obtained by minimizing the total error using a one-variable numerical optimal process. In some embodiments, the vector hysteresis analysis system 3404 combines a linear regression with a one-dimensional numerical optimization to minimize the total error to simplify the parameter identification of the vector hysteresis model.

Figure 16:
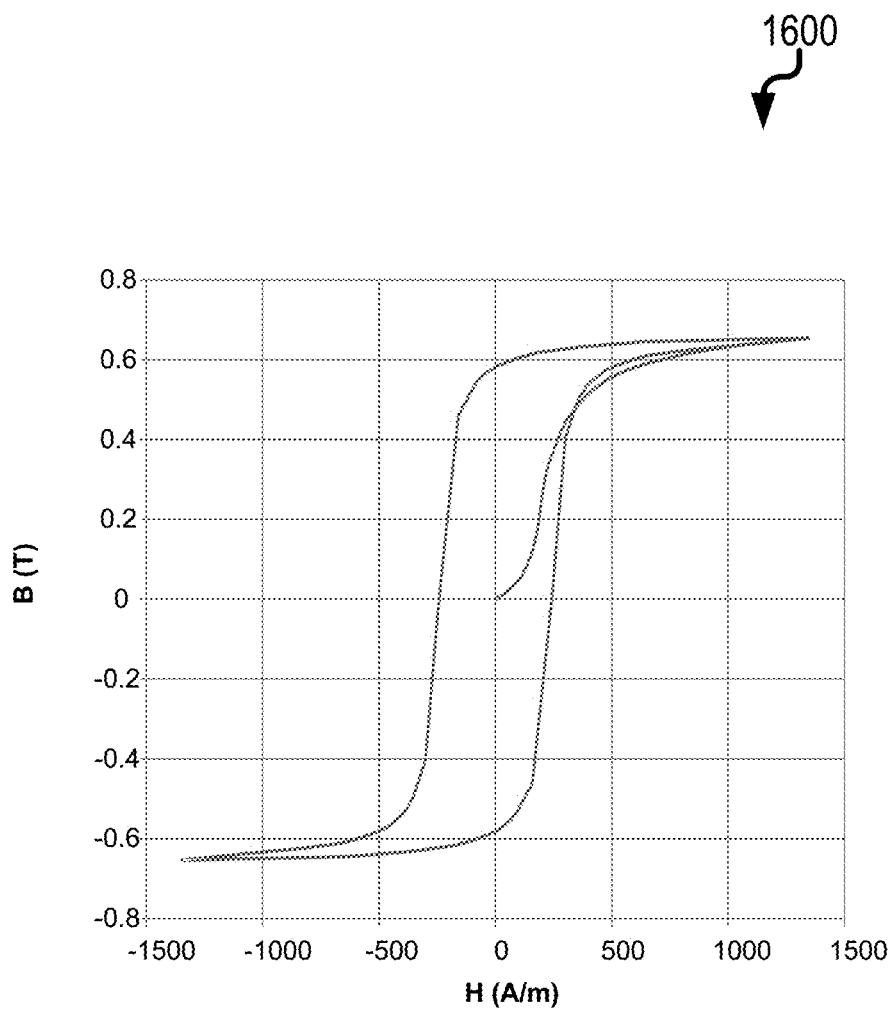
FIG. 16 depicts an example diagram showing an input normal b-h curve, an input ascending curve and an input descending curve for parameter identification of the vector hysteresis model.
Figure 17:
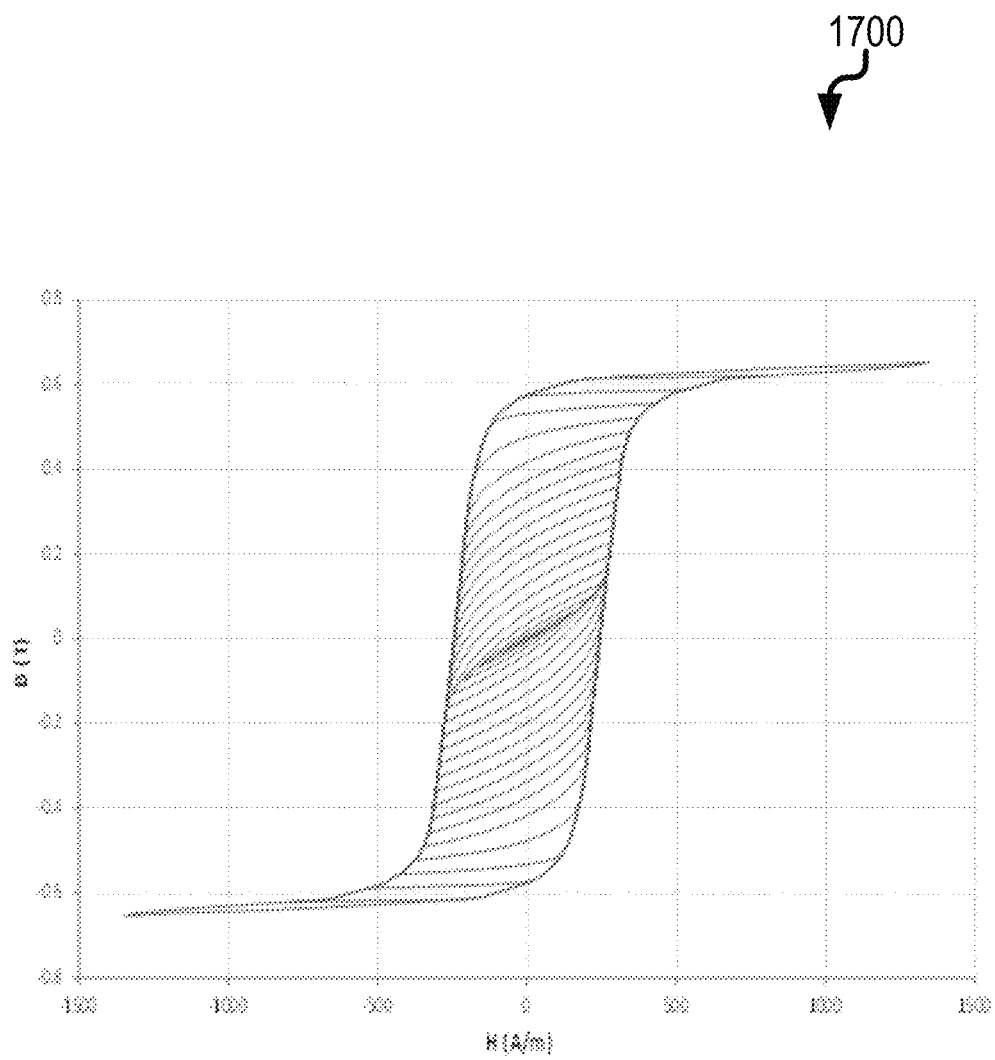
FIG. 17 depicts an example diagram showing symmetric minor loops and major loops derived from the vector hysteresis model based on identified parameters.

FIG. 16 depicts an example diagram 1600 showing an input normal b-h curve, an input ascending curve and an input descending curve for parameter identification of the vector hysteresis model. FIG. 17 depicts an example diagram 1700 showing symmetric minor loops and major loops derived from the vector hysteresis model based on identified parameters.

I. Anisotropic Vector Play Model

For an anisotropic hysteresis material, the magnetic hysteresis property in one principal axis can be different from those in other principal axes. When an alternating magnetic field h(t) is applied in a principal direction, a lagging alternating flux density b(t), in the same direction as h(t), will be produced, performing a hysteresis loop. The hysteresis loops in different principal directions can be different. The magnetic hysteresis loops in principal directions can be determined for constructing an anisotropic vector hysteresis model.

Figure 18:
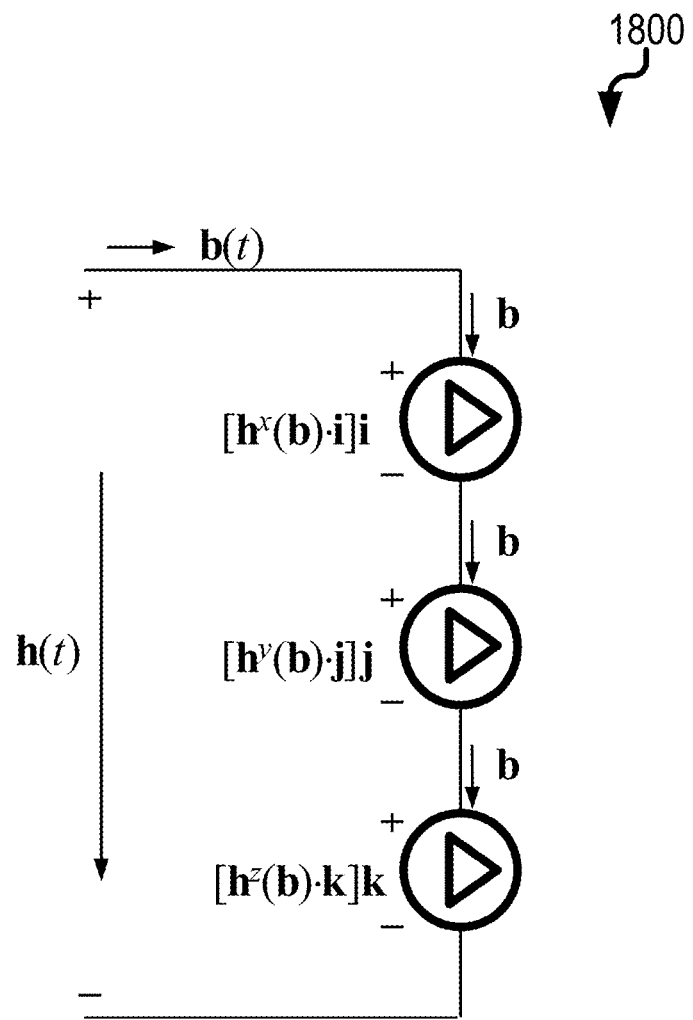
FIG. 18 depicts an example diagram showing an anisotropic vector play model based on isotropic vector play hysterons.

An anisotropic vector play model receives input of one major hysteresis loop in each principal direction. The anisotropic hysteresis properties in other directions can be obtained based on the three (for 3D) or two (for 2D) hysteresis properties of the principal directions. Using one isotropic vector play hysteron, which can be identified from the major hysteresis loop, in each principal direction, the vector play hysterons in all principal directions can be based on the same vector flux density input, as shown in the series connected circuit 1800 of FIG. 18. The series connected circuit 1800 can include $h^x(b)$, $h^y(b)$, and $h^z(b)$ which represent responses of isotropic vector play hysterons of the x, y, and z-axes from computed using Equation (19), respectively. The unit vectors i, j, and k correspond to the x-, y-, and z-axes, respectively.

As a result, the output of the anisotropic vector play model can be:

$$h(t)=[h^x(b)\cdot i]i+[h^y(b)\cdot j]j+[h^z(b)\cdot k]k \quad (32)$$

When the major hysteresis loops in each principal direction are the same, it follows that $$h(t)=h^x(b)=h^y(b)=h^z(b) \quad (33)$$

and the anisotropic vector play model degenerates to the isotropic vector play model. When an alternating flux density is applied in any principal direction, for example in the x-axis, the outputs of the isotropic vector play hysterons have only the x-axis component, that is:

$$h^y(b)\cdot j=h^z(b)\cdot k=0 \quad (34)$$

From Equation (34), the anisotropic vector hysteresis model can reduce to the scalar model:

$$h_x(t)=h(t)\cdot i=h^x(b)\cdot i=h^x(b) \quad (35)$$

In one example, an isotropic magnetic steel with measured major loop, as shown in FIG. 13 can be used as input. The laminated stack of the steel sheets has the anisotropic hysteresis properties. In order to generate a visible equivalent hysteresis loop in the normal direction of the laminations, which is noted as the hard direction, a virtual stacking factor can be assumed to be 0.999.

The isotropic vector play model can take into account the lamination effects and be used to simulate the laminated stack. The outputs of which can be taken as the numerical measured data. The measured principal hysteresis properties, in the easy and hard axes as shown in plot 1900 of FIG. 19, can be employed as the inputs of the anisotropic hysteresis model. The measured hysteresis properties under alternating fields in other directions and those under rotating fields can be used to validate the anisotropic hysteresis model.

Figure 20:
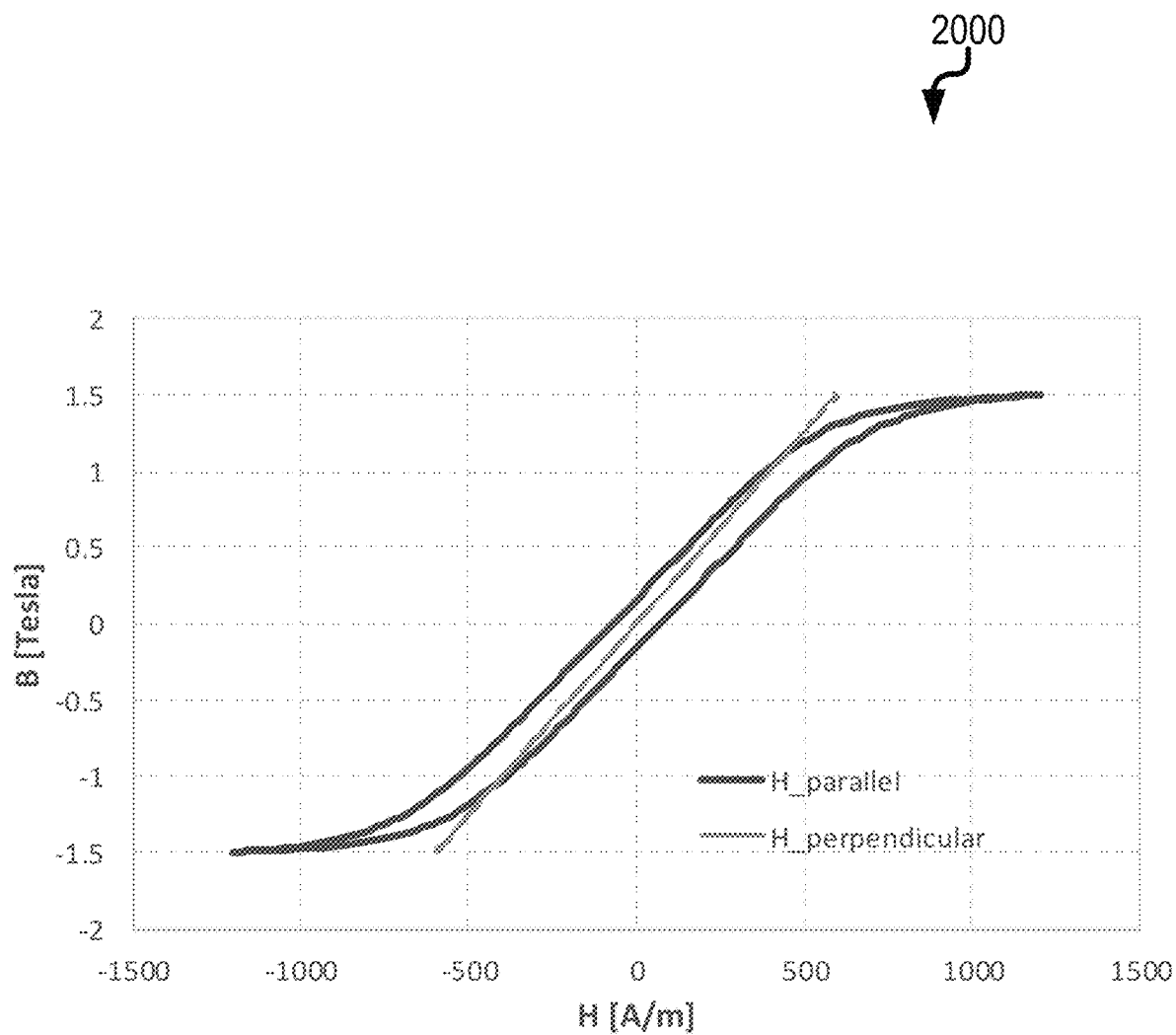
FIG. 20 depicts an example plot of simulated hysteresis loops.
Figure 21:
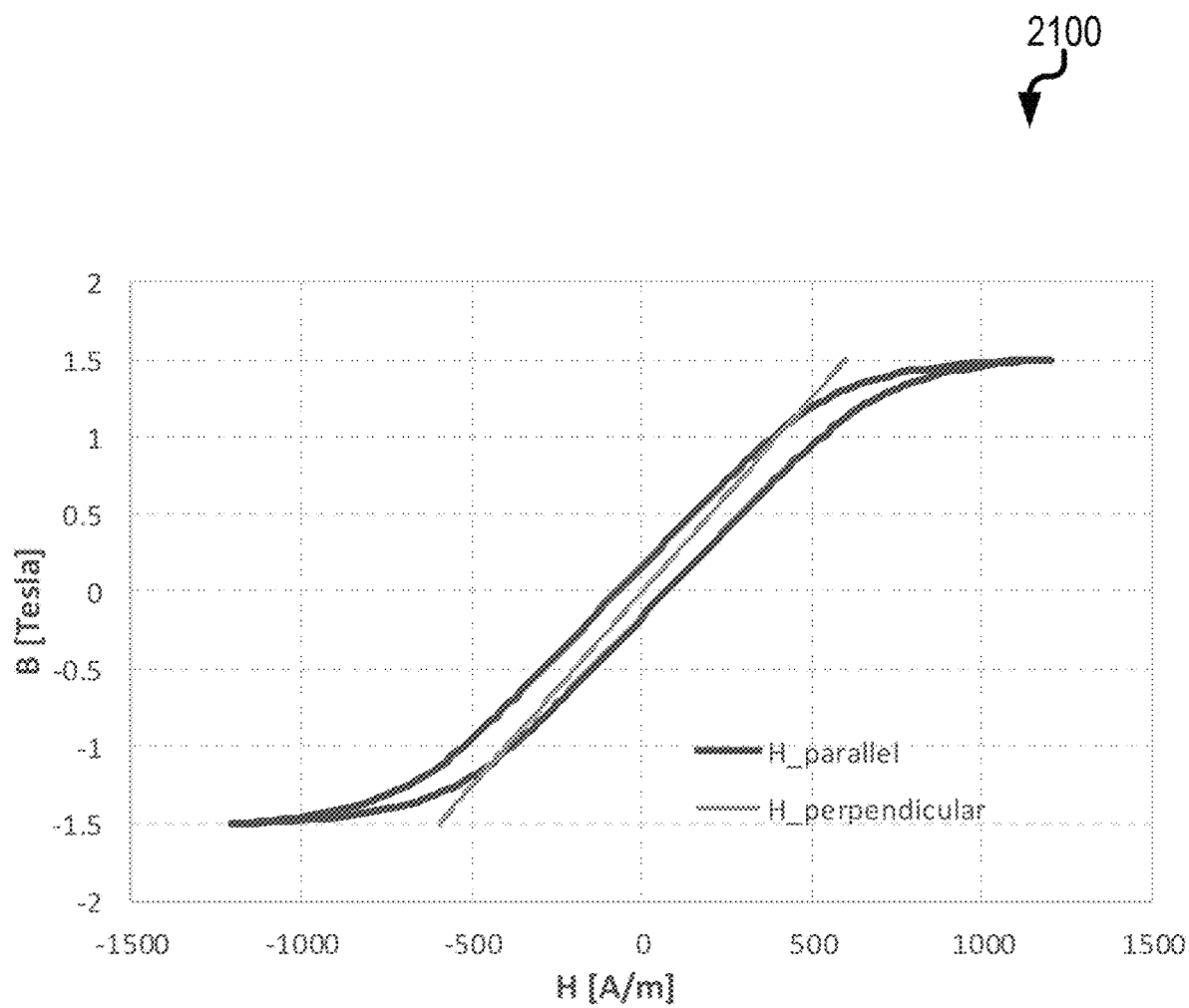
FIG. 21 depicts an example plot of numerically measured hysteresis loops.
Figure 22:
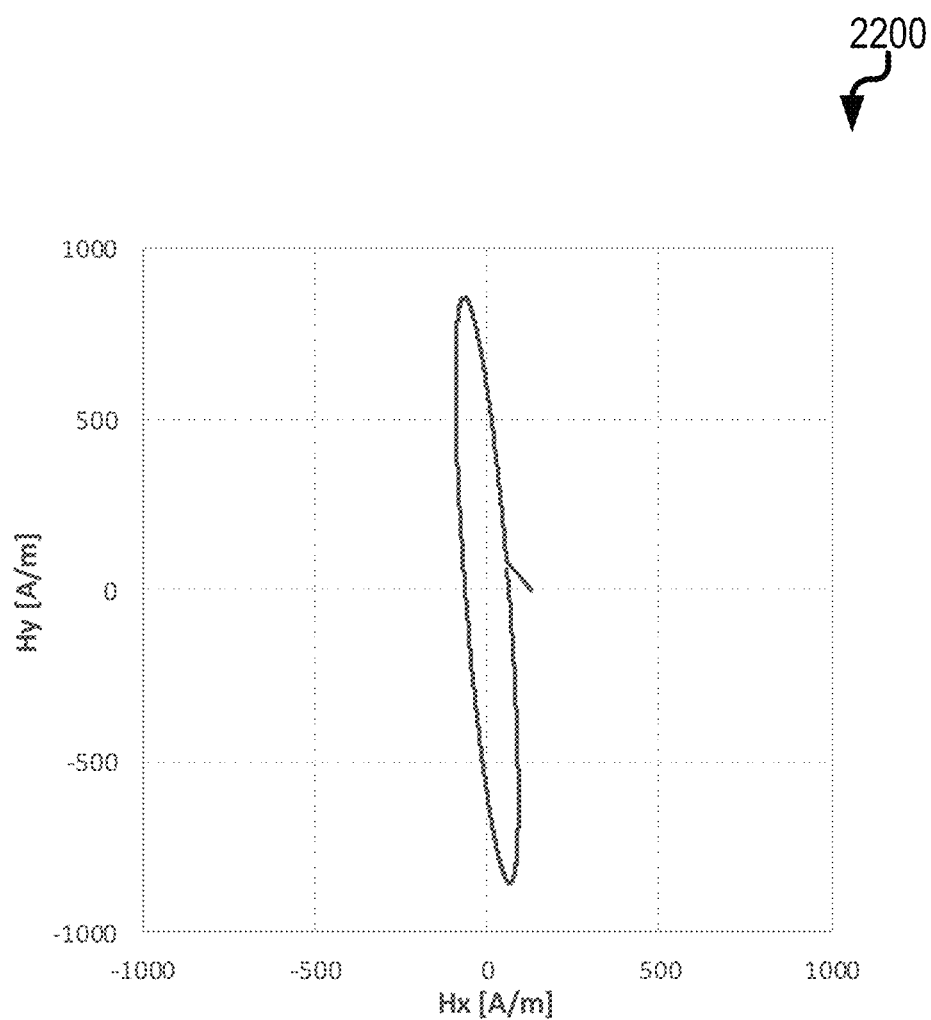
FIG. 22 depicts an example plot of simulated loci of a magnetic field.
Figure 23:
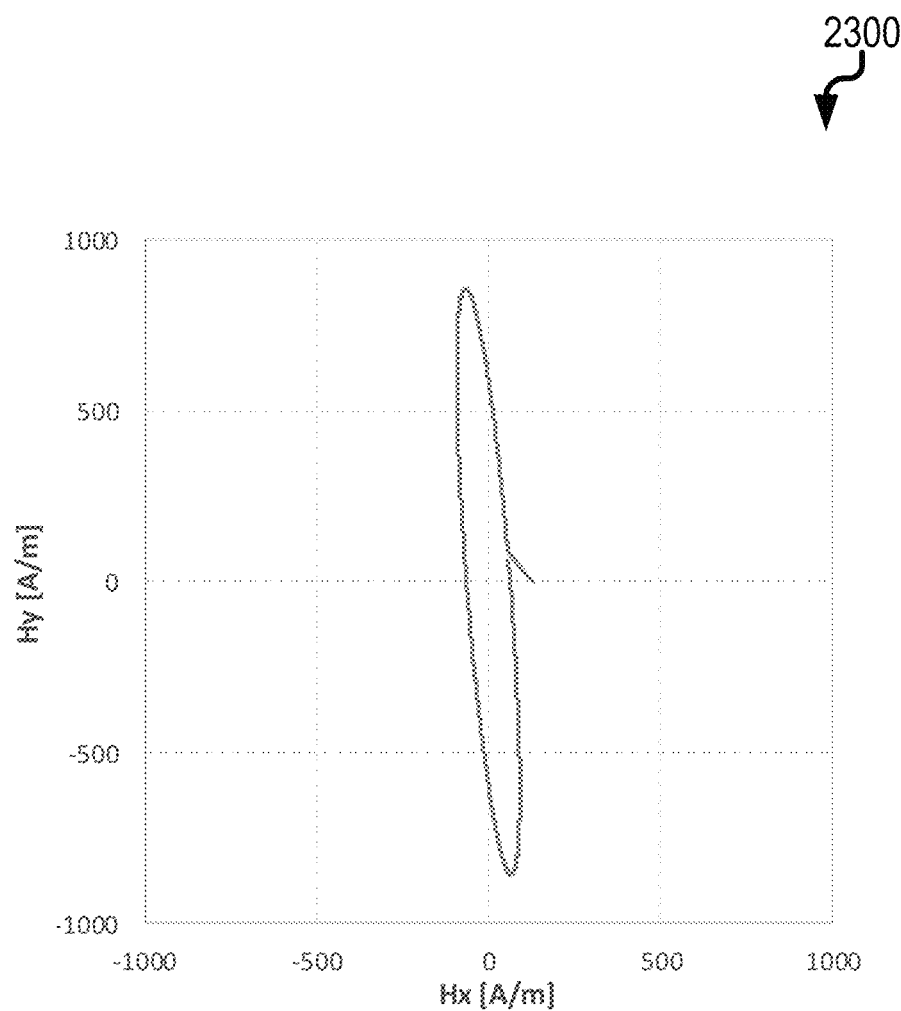
FIG. 23 depicts an example plot of numerically measured loci of a magnetic field.

When an alternating flux density b(t) with $b_m$=1.5 Tesla is applied, for example, in the 45° direction from the easy axis, the field intensity h(t) direction may not align with the b direction. The h vector can be decomposed into two components, $h_{//}$ component which is paralleled to b, and $h_\perp$ component which is perpendicular to b. The simulated hysteresis loops for both $h_{//}$ and $h_\perp$, as shown in plot 2000 of FIG. 20, can be compared with the measured data of plot 2100 in FIG. 21. The simulated results can be obtained from the solid anisotropic hysteresis material simulated by the anisotropic hysteresis model. The numerical measured data can be obtained from the laminated isotropic stack simulated by the isotropic hysteresis model Plot 2200 of FIG. 22 depicts the simulated loci of h for rotating flux density b with $b_m$=1.0 Tesla, compared with the measured loci of plot 2300 of FIG. 23, where x and y-axes represent the easy and hard directions, respectively. At the rotating start point, h direction aligns with b direction.

J. Adaptive Fixed Point Iteration Algorithm

For continuous nonlinear functions $$y=f(x) \quad (36)$$

if y is known as $y_0$, the equation can be rewritten as:

$$x=F(x) \quad (37)$$

The root of the equation can be computed by the fixed point iteration as $$x_{k+1}=F(x_k), k=0,1,2,\ldots \quad (38)$$

For an interval [a, b], if $$|F(b)-F(a)|\leq L|b-a| \quad (39)$$

where L is the slope, the iteration of Equation (38) can converged to a fixed point as long as $$L<1 \quad (40)$$

as it follows:

$$|x_{k+1}|=|F(x_k)-F(x_{k-1})|\leq L|x_k+x_{k+1}|\leq L^k|x_1-x_0| \quad (41)$$

Equation (41) shows the smaller the L, the faster the iteration can converge. Equation (37) can be constructed in many different ways. In one example, $$F(x) = C + \frac{y_0 - f(x)}{c} \quad (42)$$

where c can be a constant provided Equation (39) is satisfied. From Equation (42), as long as F(x) converges to x, $$y_0 = f(x) \quad (43)$$

is satisfied.

In one example, an inductor with uniform cross-section core excited by a coil of N turns carrying a current of i(t) can have a fixed point iteration in the B-correction scheme of:

$$b_{k+1} = b_k + \frac{h_a - h(b_k)}{v_{FP}} = F(b_k) \quad (44)$$

where $$h(a) = \frac{Ni(t)}{l} \quad (45)$$

is a constant during the iteration, l is the average length of the core, and $v_{FP}$ is a constant relucitivilty that can be freely selected based on compliance with Equation (39). This example, assumes, that the core is treated as a one-dimensional element and the magnetic property is expressed as h(b) a graph of which is shown in plot 2400 of FIG. 24.

Figure 25:
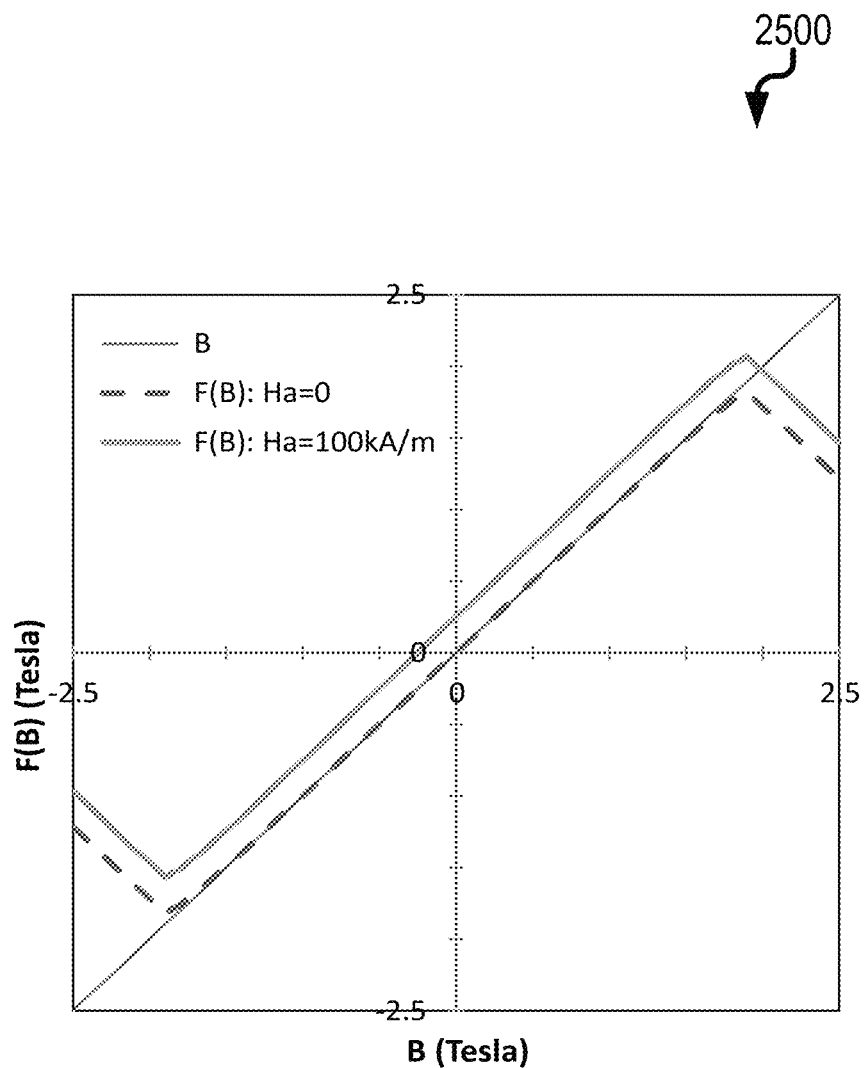
FIG. 25 depicts an example plot of a B-correction applied to a magnetic field curve.

A global-coefficient can be used such as $$v_{FP} = \frac{v_{dmax} + v_{dmin}}{2} \approx \frac{1}{2\mu_0} \quad (46)$$

where $v_{dmax}$ and $v_{dmin}$ are the maximum and minimum differential reluctivities of the curve h(b), respectively. The slope, L, of curve F(b) is smaller than 1.0 for the entire region as depicted in plot 2500 of FIG. 25. Using Equation (46), convergence can occur but can have a slow convergence rate regardless if the fixed point is in an unsaturated or a saturated region.

Figure 26:
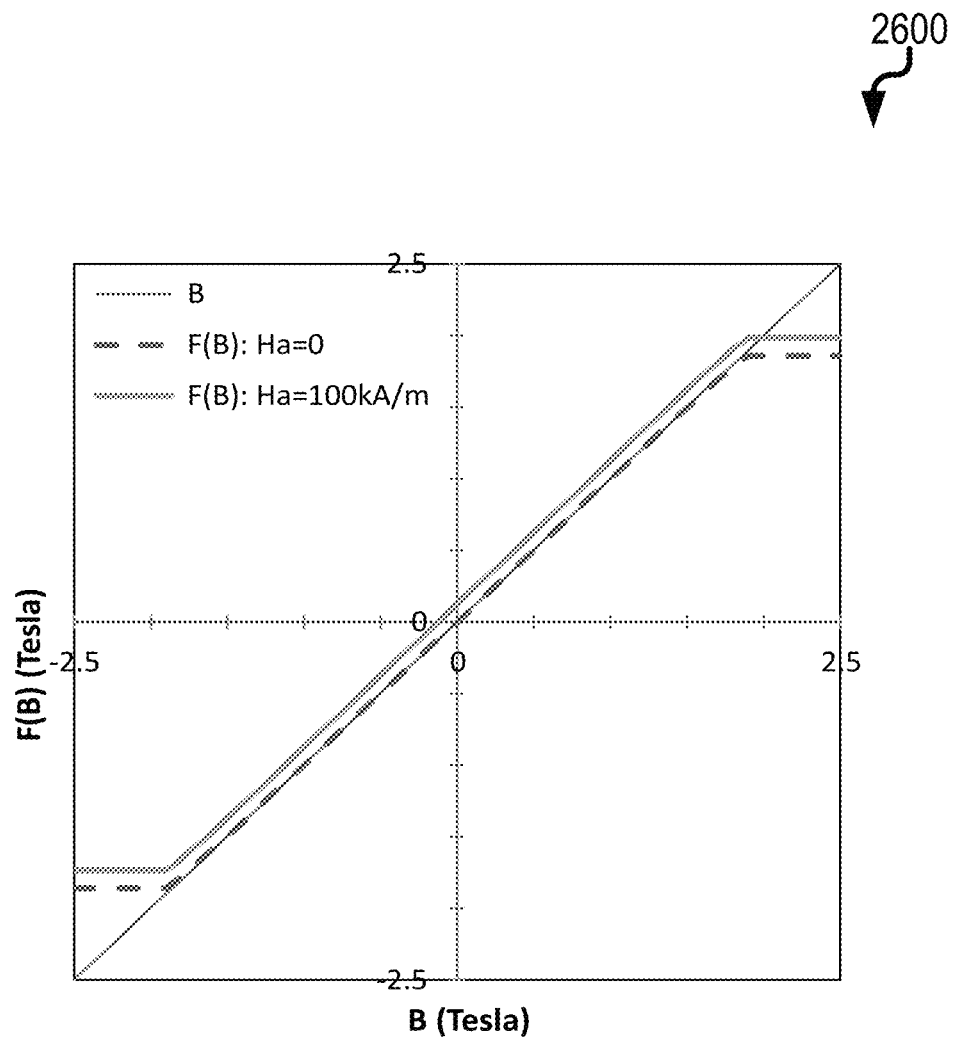
FIG. 26 depicts an example plot of an iterative function with B-corrections applied.

If a constant reluctivity is selected to satisfy $$v_{FP} = v_{dmax} = \frac{1}{\mu_0} \quad (47)$$

the iteration can converge faster when the fixed point is in the saturated region where the slope L is close to 0 as shown in plot 2600 of FIG. 26. When the fixed point is in the unsaturated region, convergence is also guaranteed, but with slow convergence rate because L is close to 1.0.

Figure 27:
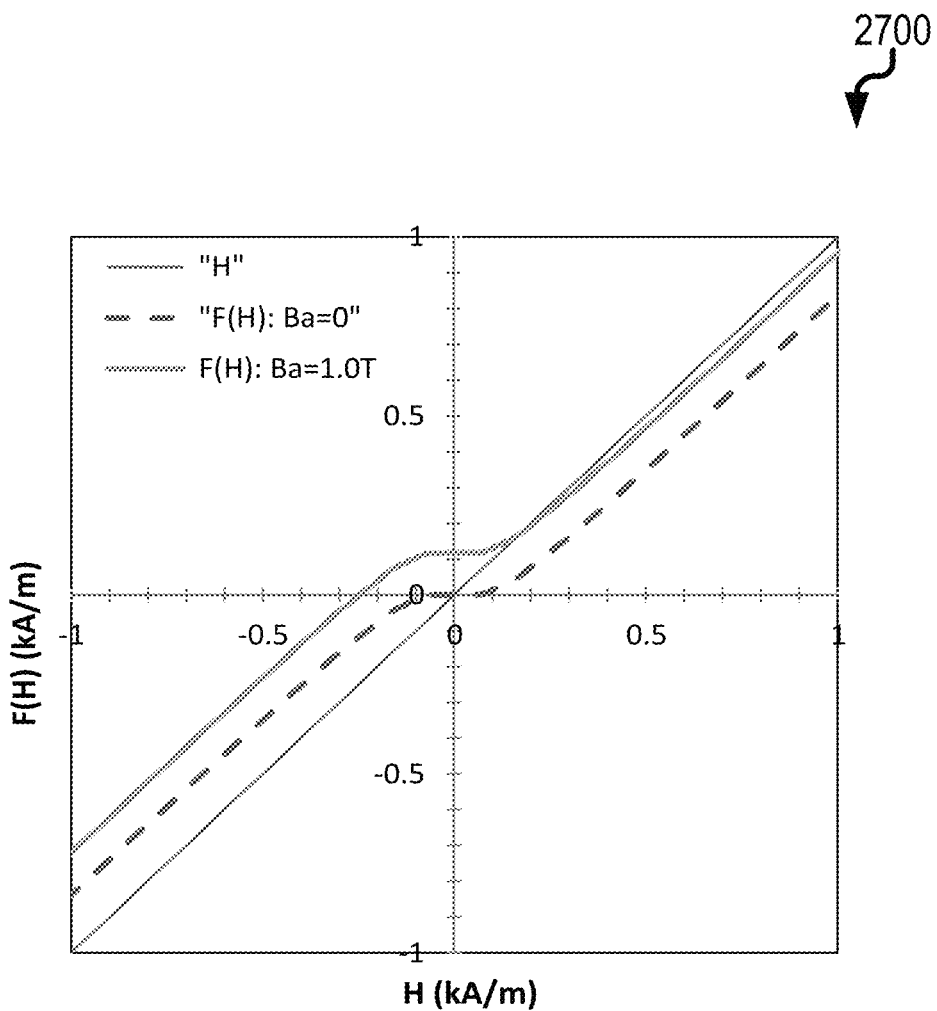
FIG. 27 depicts an example plot of an iterative function with H-corrections applied.

When magnetic property is expressed as b(h), the fixed point iteration using H-correction scheme is expressed as $$h_{k+1} = h_k + \frac{b_a - b(h_k)}{\mu_{FP}} = F(h_k) \quad (48)$$

where $b_a$ is a constant applied flux density during the iteration and $\mu_{FP}$ is a constant permeability. The constant permeability can be selected to be $$\mu_{FP} = \mu_{dmax} \quad (49)$$

where $\mu_{dmax}$ is the maximum differential permeability of the curve b(h). The performance using the H-correction scheme is different in the saturated region with very slow convergence rate and in the unsaturated region with fast convergence rate, as depicted in plot 2700 of FIG. 27.

In practical applications of 2D and 3D FEA, some numerical noise, such as meshing discretization error can occur. When the slope, L, of curve F(b), or F(h), is close to 1.0, such noise can be enlarged in the iteration process due to the cross effects of neighboring mesh elements. For stable convergence, the slope L can be close to 0, such as in the saturated region of FIG. 26, and in the non-saturated region with small field quantity of FIG. 27.

Figure 24:
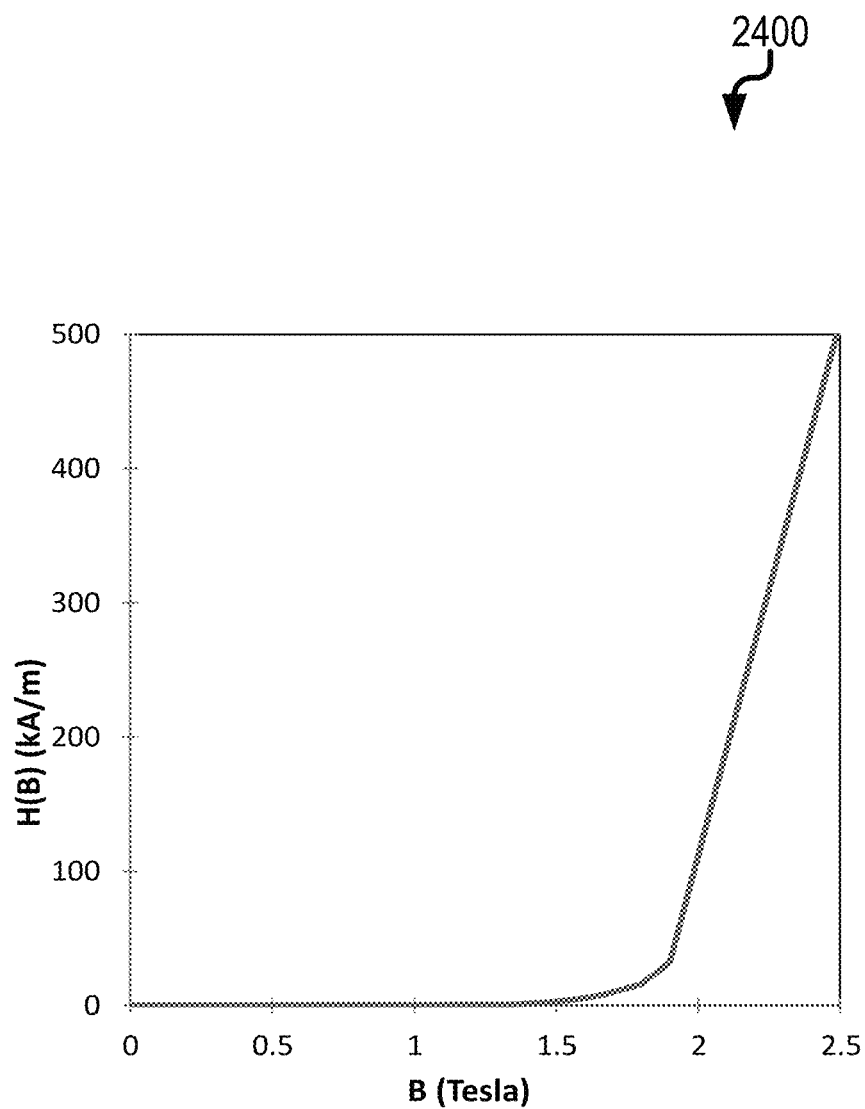
FIG. 24 depicts an example plot of an iterative function magnetic field curve of the magnetic field as a function of flux density.

The convergence behavior using different schemes is different in different regions. If, for example, the coil having properties of FIG. 24 is excited by a current source, the applied field intensity $h_a$ can be constant in each time step, and thus iteration is not required if the H-correction scheme is used. On the other hand, if the coil is excited by a voltage source, the flux linkage, thus the applied flux density $b_a$, can be considered as given with the assumption that the impact of coil resistance is trivial. In such a case, the iteration process is also not required if the B-correction scheme is used.

An adaptive fixed point iteration algorithm can alternately use the B-correction scheme and H-correction scheme so as to speed up convergence and improve the stability. The iteration can start with the B-correction scheme in which the constant reluctivity is set to the maximum differential reluctivity, or the minimum differential permeability $\mu_0$. If the solution is not converged to a given accuracy after a certain preset number of iterations, the iteration will be continued by switching to the H-correction scheme in which the constant permeability is set to the maximum differential permeability. With the combined use of the two correction schemes during the entire iteration process, the solution with the minimum error together with the scheme type will be recorded and used as the final solution at the current time step. At the same time, the recorded scheme type will be used as the initial scheme type for the next time step. Alternatively, the H-correction scheme can be first applied during this iteration process followed by the B-correction scheme.

Figure 28:
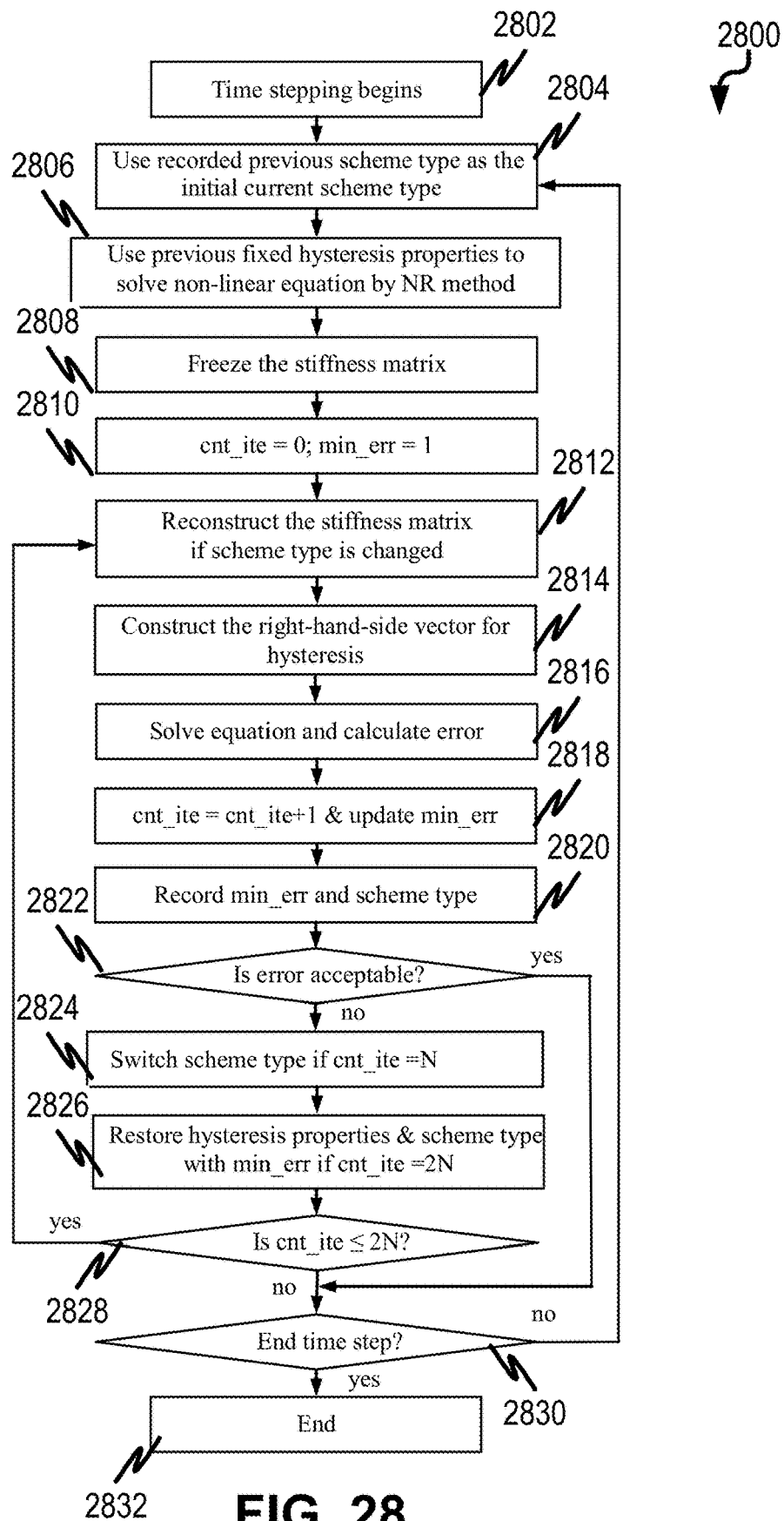
FIG. 28 depicts an example process flow diagram showing an iterative adaptive fixed point model.

FIG. 28 depicts a process flow chart 2800 of an adaptive fixed point iteration in one embodiment. Time stepping for the iteration process begins at 2802. A recorded previous scheme type is used as the initial current scheme type, at 2804. The scheme type can be either a B-correction or an H-correction. The previous fixed hysteresis properties can be used to solve the non-linear equation by the Newton-Raphson method. The stiffness matrix is frozen, at 2808. The variables corresponding to continuing the iteration, cnt_ite, and the minimum error value, min_err, are set to the values of '0' and '1', respectively, at 2810. The stiffness matrix is reconstructed if the scheme type has changed from a previous scheme type, at 2812. The right-hand-side vector for hysteresis can be constructed, at 2814. After the linear field equation is solved, the estimated field solution point for each mesh element can be obtained, based on which the error for each mesh element can be calculated at 2816. The continuing iteration variable, cnt_ite, is incremented by a value of '1' and the minimum error value variable, min_err, is updated, at 2818, based on the calculation results of 2816. The minimum error value variable, min_err, and the current scheme type of the iteration are recorded, at 2820. The error is evaluated against an error threshold, at 2822. If the error is acceptable compared to an error threshold, the current time step is compared with the stop time, at 2830. If the current step time reaches the stop time, the transient process is finished at, 2832. Otherwise, the next time step started, at 2804.

If the error is not acceptable by not meeting an error threshold value, the scheme type can be switched to a different scheme, at 2824. For example, if the iteration was completed with a B-correction scheme, then the scheme would switch to an H-correction scheme and vice versa. The hysteresis properties and scheme type with a minimum error value are restored, at 2826, if the continued iteration parameter, cnt_ite, is equivalent to 2N. If the continued iteration parameter, cnt_ite, is less than or equal to 2N, then the iteration process returns to reconstruction of the stiffness matrix, at 2812. If the continued iteration parameter, cnt_ite, is greater than 2N, then the current time step is compared with the stop time, at 2830. If the current time step reaches the stop time, the transient process is finished, at 2832. Otherwise, the next time step starts, to 2804.

During the fixed point iteration, the linearized magnetic property can be expressed as $$b = [\mu_k](h - h_{ck}) \quad (50)$$

where $[\mu_k]$ is the permeability tensor and $h_{ck}$ is the intercept of h as defined by the anistropic hysteresis model. When the $[\mu_k]$ and $h_{ck}$ are known, the linearized magnetic property of Equation (50) can be used to solve for the magnetic field and the solution for $b_{k+1}$ and $h_{k+1}$ can be obtained. The solution point $(b_{k+1}, h_{k+1})$ which satisfied Equation (50) is $$b_{k+1} = [\mu_k](h_{k+1} - h_{ck}). \quad (51)$$

Based on Equation (51) the solutions for $b_{k+1}$ and $h_{k+1}$ can be obtained from the magnetic field solution. When the B-correction scheme is used, the permeability tensor can remain constant as $$[\mu_{k+1}] = \begin{bmatrix} \mu_0 & 0 & 0 \\ 0 & \mu_0 & 0 \\ 0 & 0 & \mu_0 \end{bmatrix}. \quad (52)$$

Figure 29:
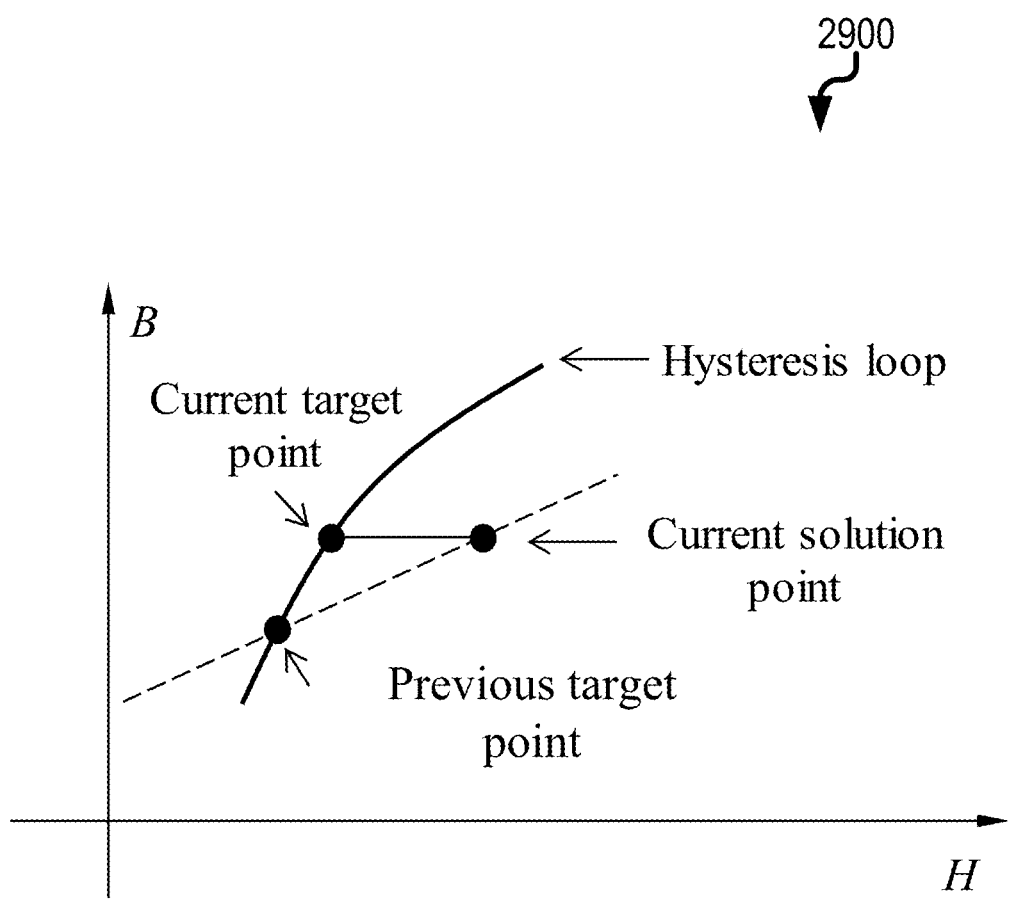
FIG. 29 depicts an example plot showing a B-correction scheme.

According to $b_{k+1}$, $h'_{k+1}$ can be derived from the anisotropic hysteresis property $h(b_{k+1})$, as shown in plot 2900 of FIG. 29. The point $(h'_{k+1}, b'_{k+1})$, where $$b'_{k+1} = b_{k+1} \quad (53)$$

for the B-correction scheme is depicted in FIG. 29 as the target point. The updated intercept, h, can be $$h_{ck+1} = h'_{k+1} - [\mu_{k+1}]^{-1} b'_{k+1}. \quad (54)$$

The difference between the target point and the solution point denotes the error. The fixed point iteration process can stop when the total error is smaller than an error threshold.

For the H-correction scheme, the permeability tensor keeps constant as $$[\mu_{k+1}] = [\mu_k] = \begin{bmatrix} \mu^x_{max} & 0 & 0 \\ 0 & \mu^y_{max} & 0 \\ 0 & 0 & \mu^z_{max} \end{bmatrix} \quad (55)$$

where $\mu^x_{max}$, $\mu^y_{max}$, and $\mu^z_{max}$ are the maximum differential permeability of major hysteresis loops in the x, y, and z-axes, respectively. The target point $(h'_{k+1}, b'_{k+1})$ is derived from $$h'_{k+1} = h_{k+1} \quad (56)$$

where $b'_{k+1}$ is expressed as $b(h_{k+1})$.

In order to utilize the proposed adaptive fixed point iteration algorithm, the magnetic property can be expressible in both forms of h(b) and b(h). With a given b, the input of isotropic vector play hysteron in each principal axis is known, and the output h is obtained from Equation (19), where $h_{re}$ can be derived by the local iteration process using a B-correction.

Figure 30:
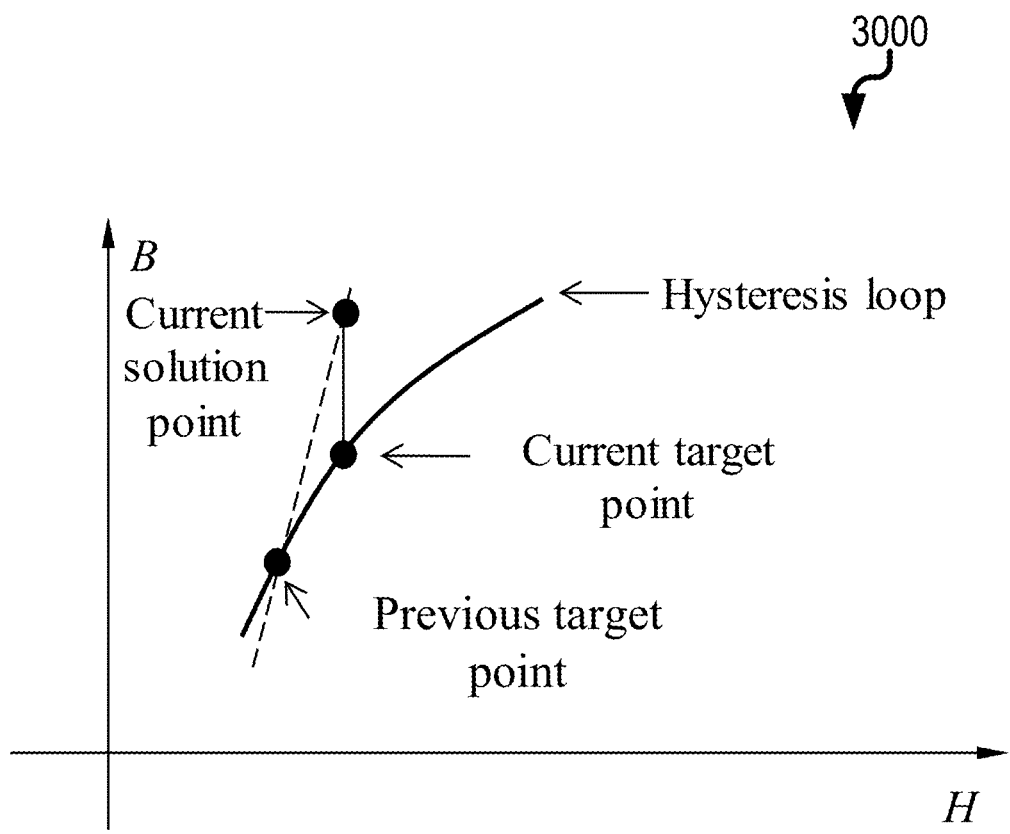
FIG. 30 depicts an example plot showing a H-correction scheme.

In the adaptive fixed point iteration algorithm, the current target point can be determined by deriving h from b in terms of the B-correction scheme, or by deriving b from h in terms of the H-correction scheme, based on the current solution point as depicted in FIG. 29 and plot 3000 of FIG. 30.

In the H-correction scheme, to derive b from h for the isotropic vector play hysteron in each principal axis, the solution point of each play hysteron from the FEA solution $b_{k+1}$ can be obtained. For a B-correction scheme, h is derived in terms of b. For an H-correction scheme, b is derived in terms of h. With a recorded target point of the previous iteration in the v-axis (v stands for x, y, z) is $(h'^v_k, b'^v_{k+1})$ and the permeability is $\mu^v_k$, the solution point $(h^v_{k+1}, b^v_{k+1})$ in the same axis satisfies $$h^v_{k+1} = h'^v_k - \frac{(b^v_{k+1} - b'^v_k)}{\mu^v_k} \quad (57)$$

where $$b^v_{k+1} = b_{k+1} \text{ for } v = x, y, z \quad (58)$$

The updated current target point $(h'^v_{k+1}, b'^v_{k+1})$ can be derived based on $$\begin{cases} h'^v_{k+1} = h^v_{k+1} \\ b'^v_{k+1} = b(h'^v_{k+1}) \end{cases} \quad (59)$$

From Equation (58) and Equation (59), even though the flux density vectors $b^v_{k+1}$ of the salutation points for all principal axes (v=x, y, z) are the same, the flux density vectors $b'^v_{k+1}$ of the target points derived from different principal isotropic play hysterons are different during the iterating process. The resultant anisotropic target point is obtained from $$\begin{cases} h'_{k+1} = [h'^x_{k+1} \cdot i]i + [h'^y_{k+1} \cdot j]j + [h'^z_{k+1} \cdot k]k \\ b_{k+1} = [b'^x_{k+1} \cdot i]i + [b'^y_{k+1} \cdot j]j + [b'^z_{k+1} \cdot k]k \end{cases} \quad (60)$$

The field intensity vector $h'_{k+1}$ of the target points equals the vector $h_{k+1}$ of the solution points. As the iteration converged, the target point approaches to the solution point in isotropic play hysterons, and the flux density vectors $b'^v_{k+1}$ of the target points (for v=x, y, z) converge to $b_{k+1}$.

Figure 19:
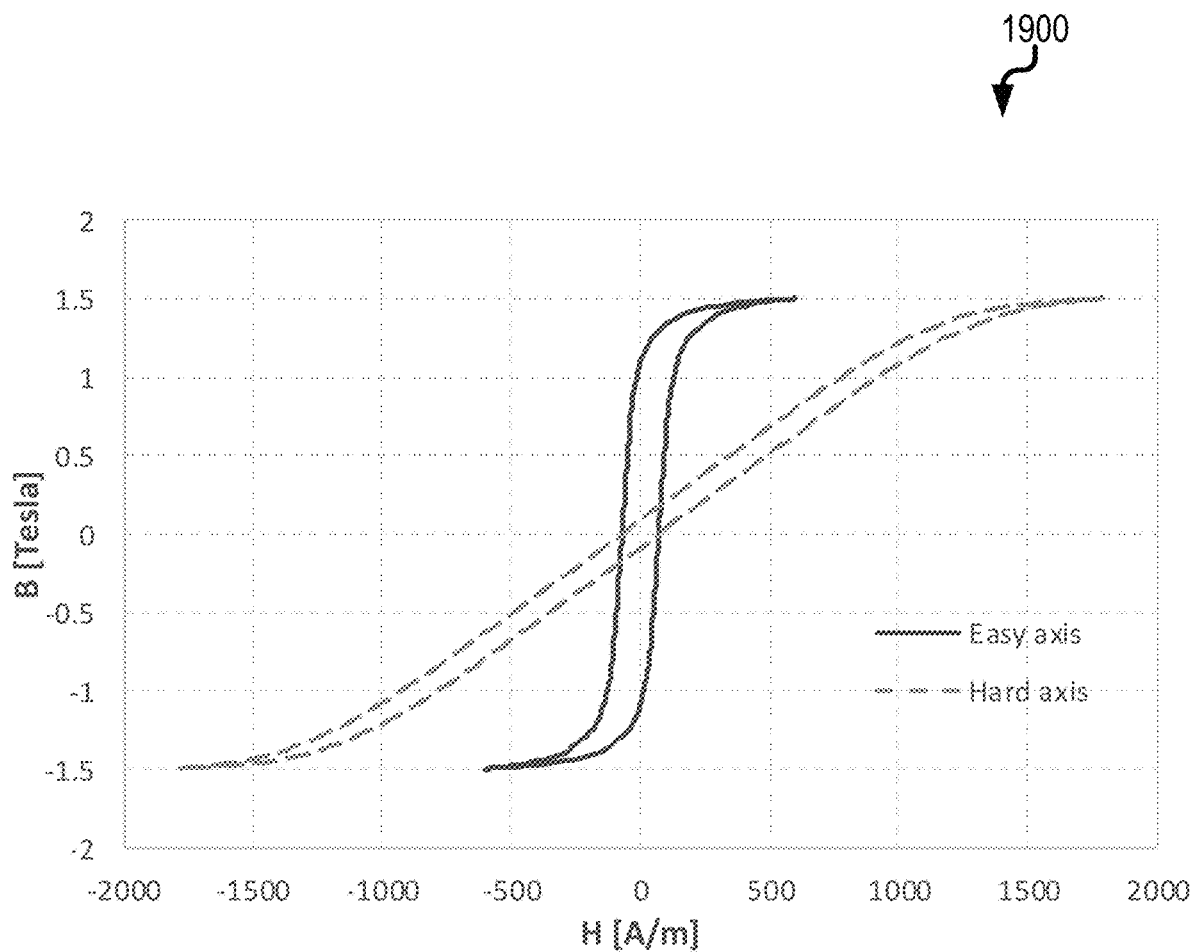
FIG. 19 depicts an example plot of major hysteresis loops in the easy and hard axes, used as the inputs of to anisotropic hysteresis model.
Figure 31:
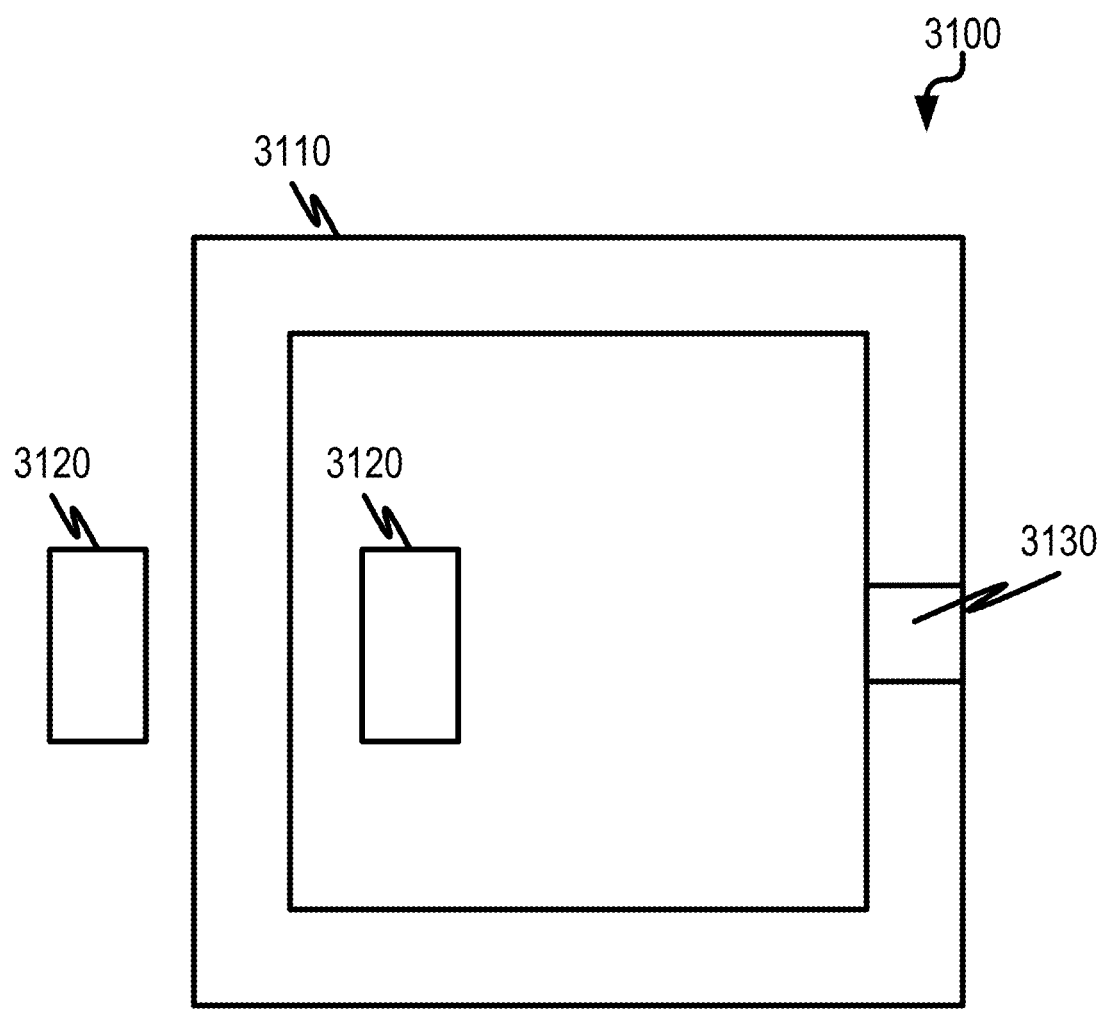
FIG. 31 depicts an example inductor with a hysteresis core.

In one validation example, an inductor system 3100 as shown in FIG. 31 can be taken as a benchmark to compare the average iteration numbers among different iteration types. The inductor system 3100 can have an inductor with linear media 3110, hysteresis media 3130 and coils 3120 wrapped around the inductor. The input major hysteresis loops as shown in FIG. 19 can be used. In this example, the maximum iteration number is set to 1000, and the error target is set to $10^{-3}$.

Figure 32:
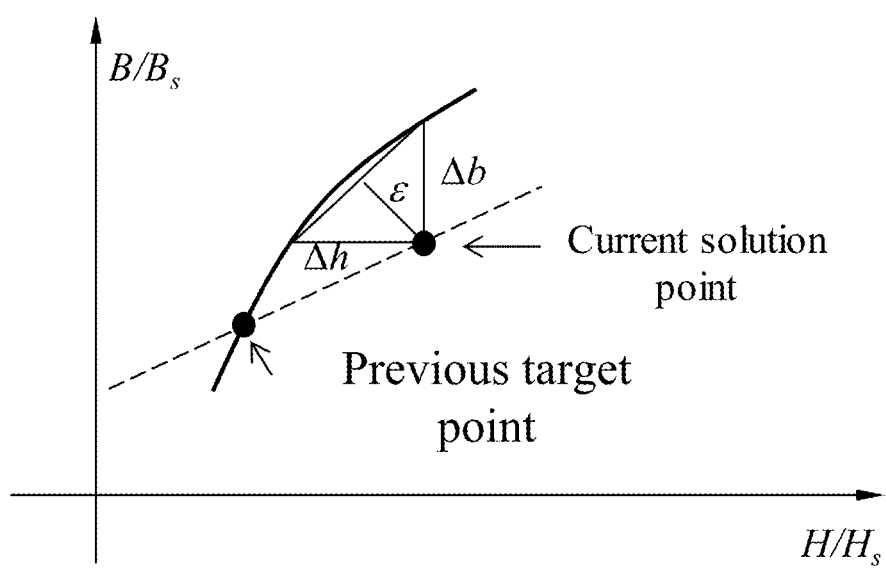
FIG. 32 depicts an example plot showing error computation for a principal play hysteron in a mesh element.

The error for each iteration can be computed by $$err_k = \sqrt{\frac{1}{n}\sum_{i=1}^{n}\sum_{v=x,y,z}(\varepsilon^v)^2} \quad (61)$$

where n is the total number of mesh elements with hysteresis material, and ε is the error of the temporary solution for a principal play hysteron in a mesh element. The error can be defined as the normalized minimum distance from the temporary solution to a local hysteresis loop and measured by $$\varepsilon = \frac{\Delta h \cdot \Delta b}{\sqrt{\Delta h^2 + \Delta b^2}} \quad (62)$$

where Δh and Δb are defined in plot 3200 of FIG. 32.

Figure 33:
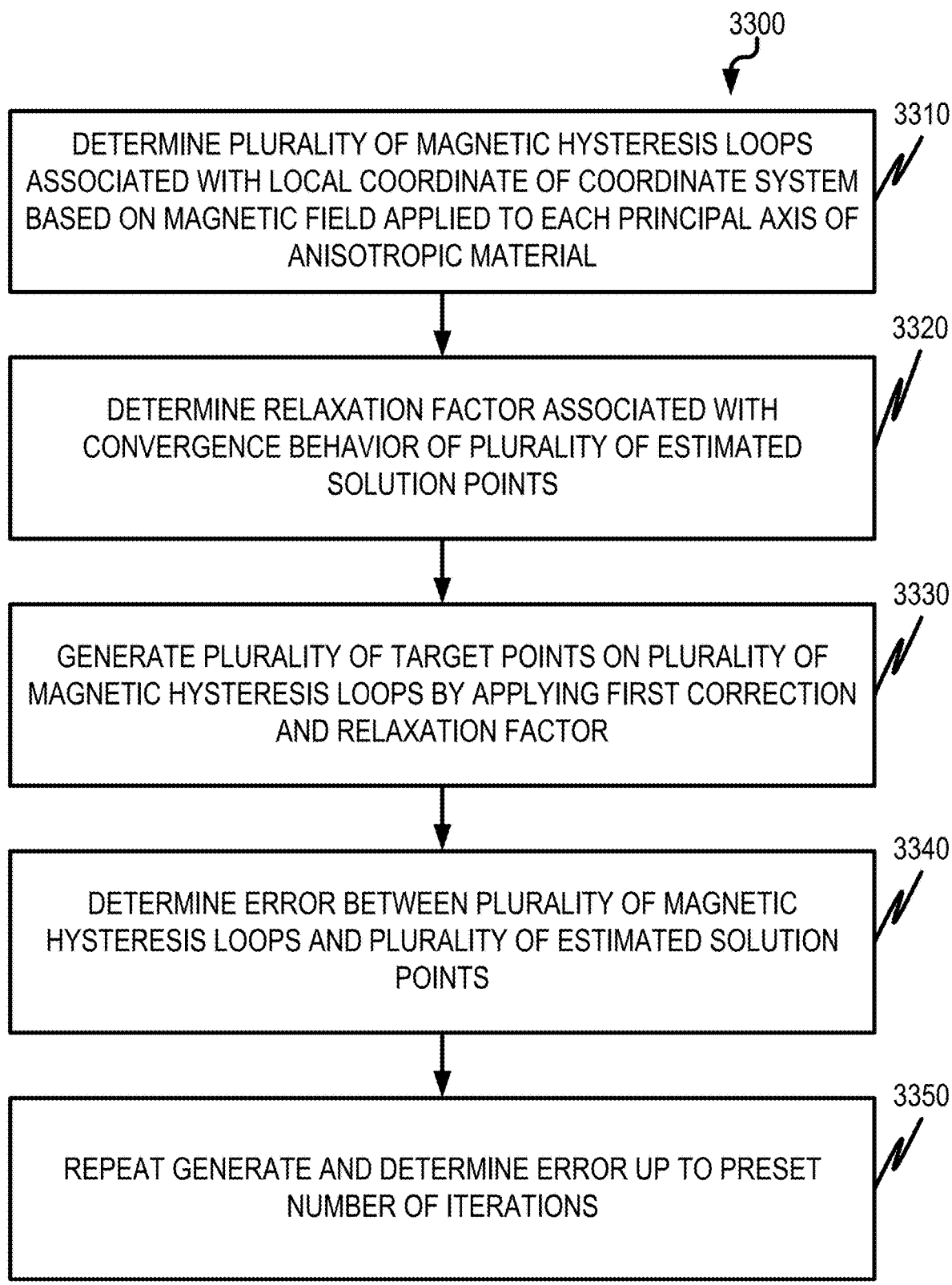
FIG. 33 depicts a process flow diagram illustrating analysis of an anisotropic magnetic material.

FIG. 33 depicts a process flow diagram 3300 of analyzing the magnetic hysteresis of an anisotropic magnetic material in one example. A plurality of magnetic hysteresis loops based on a magnetic field successively applied to each principal axis of the anisotropic magnetic material are determined, at 3310 (e.g., based on data extracted from a physical system or data associated with a physical system being designed or whose design is being modified). A relaxation factor associated with the plurality of estimated solution points is determined, at 3320. A plurality of target points on magnetic hysteresis loops are generated, at 3330, by applying a first correction and the relaxation factor. The first correction is either a flux density correction or a magnetic field correction. An error between the plurality of magnetic hysteresis loops and the plurality of estimated solution points is determined, at 3340. The generation of first plurality of target points and determination of an error can be repeated, at 3350, up to a preset number of iterations. Based on the determined error, a physical system being designed can be modified so as to substantially eliminate the error between the plurality of hysteresis loops and the plurality of estimated solution points.

Figure 34:
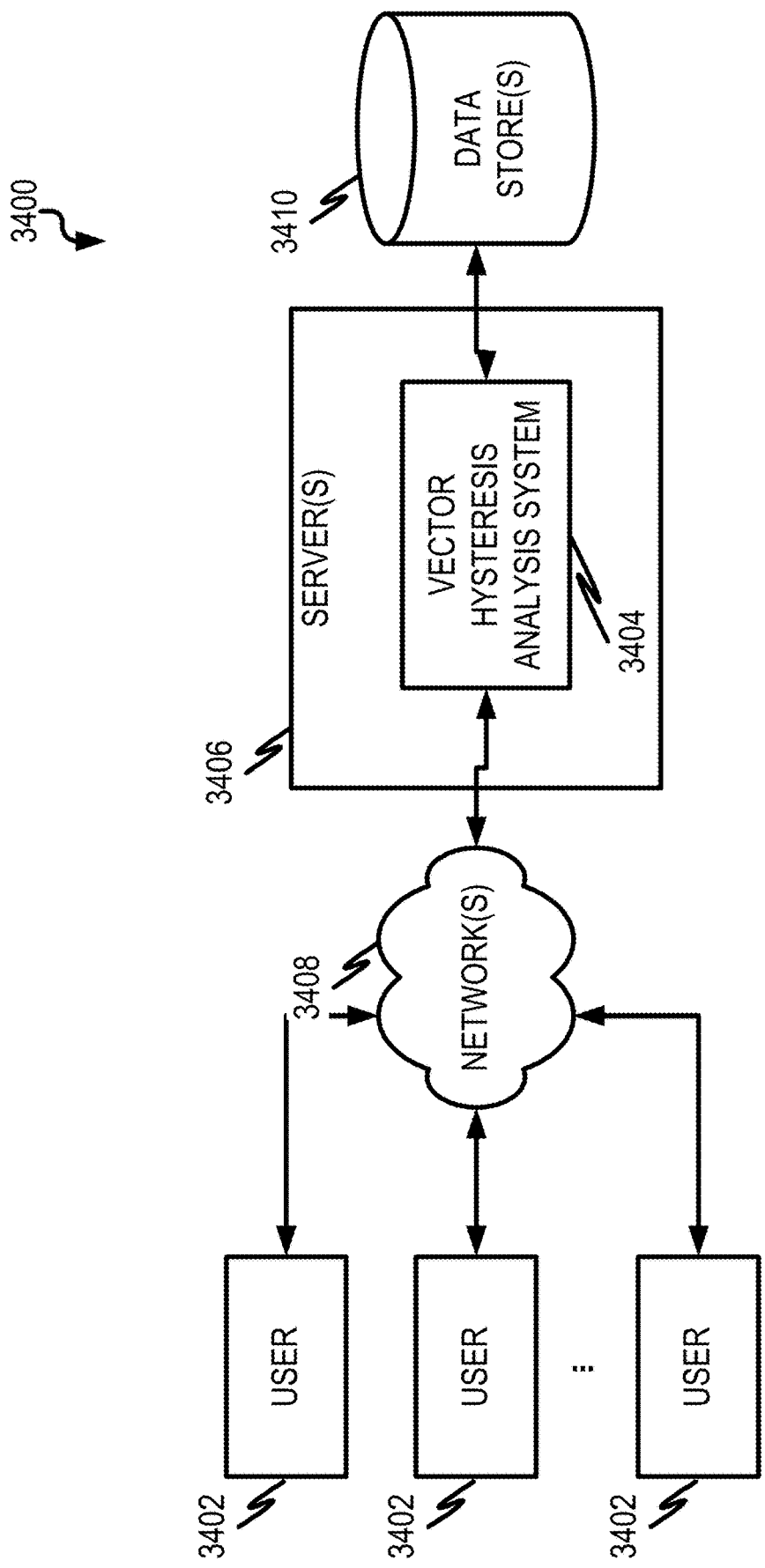
FIG. 34 depicts an example computer-implemented environment wherein users can interact with a vector hysteresis analysis system hosted on one or more servers through a network.

FIG. 34 depicts an example computer-implemented environment 3400 wherein users 3402 can interact with a vector hysteresis analysis system 3404 hosted on one or more servers 3406 through a network 3408. The vector hysteresis analysis system 3404 can assist the users 3402 to generate a vector hysteresis model for analyzing magnetic hysteresis of a magnetic material (e.g., to predict the magnetic hysteresis behavior of the magnetic material).

As shown in FIG. 34, the users 3402 can interact with the vector hysteresis analysis system 3404 through a number of ways, such as over one or more networks 3408. One or more servers 3406 accessible through the network(s) 3408 can host the vector hysteresis analysis system 3404. The one or more servers 3406 can also contain or have access to one or more data stores 3410 for storing data for the vector hysteresis analysis system 3404.

The vector hysteresis analysis system 3404 determines the vector hysteresis model that satisfy certain properties or basic rules: i) a saturation property (e.g., magnetization being limited to saturation for any magnetizing process); ii) a reduction property (e.g., the vector hysteresis model being reduced to a scalar model for a large field applied in a fixed direction if a magnetic material is originally demagnetized); iii) a rotational symmetry property (e.g., a locus of magnetization vector tip tracing out a circle for any rotating field); iv) a rotational loss property (e.g., the hysteresis loss approaching zero for large rotating fields).

Specifically, the vector hysteresis analysis system 3404 determines a specific vector play operator for the vector hysteresis model to satisfy the rotation loss property beyond saturation. The specific vector play operator for the vector hysteresis model determined by the vector hysteresis analysis system 3404 is different from the ordinary vector play operator for the ordinary vector play model which is derived from a scalar play model.

Figure 35:
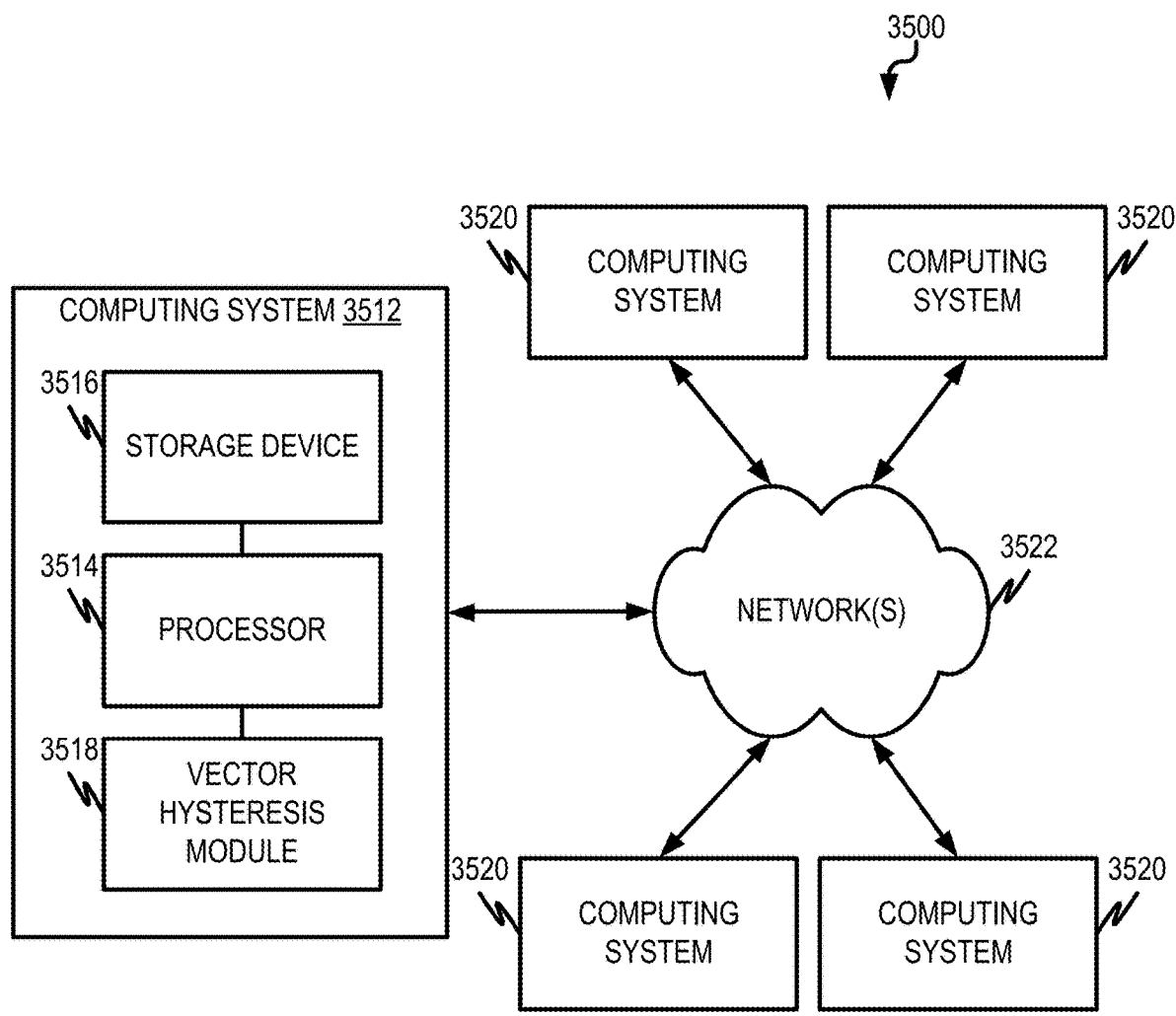
FIG. 35 depicts an example diagram showing a system for vector hysteresis analysis.

FIG. 35 depicts an example diagram showing a system 3500 for vector hysteresis analysis. As shown in FIG. 35, the system 3500 includes a computing system 3512 which contains a processor 3514, a storage device 3516 and a vector hysteresis analysis module 3518. The computing system 3512 includes any suitable type of computing device (e.g., a server, a desktop, a laptop, a tablet, a mobile phone, etc.) that includes the processor 3514 or provide access to a processor via a network or as part of a cloud based application. The vector hysteresis analysis module 3518 includes tasks and is implemented as part of a user interface module (not shown in FIG. 35).

Figure 36:
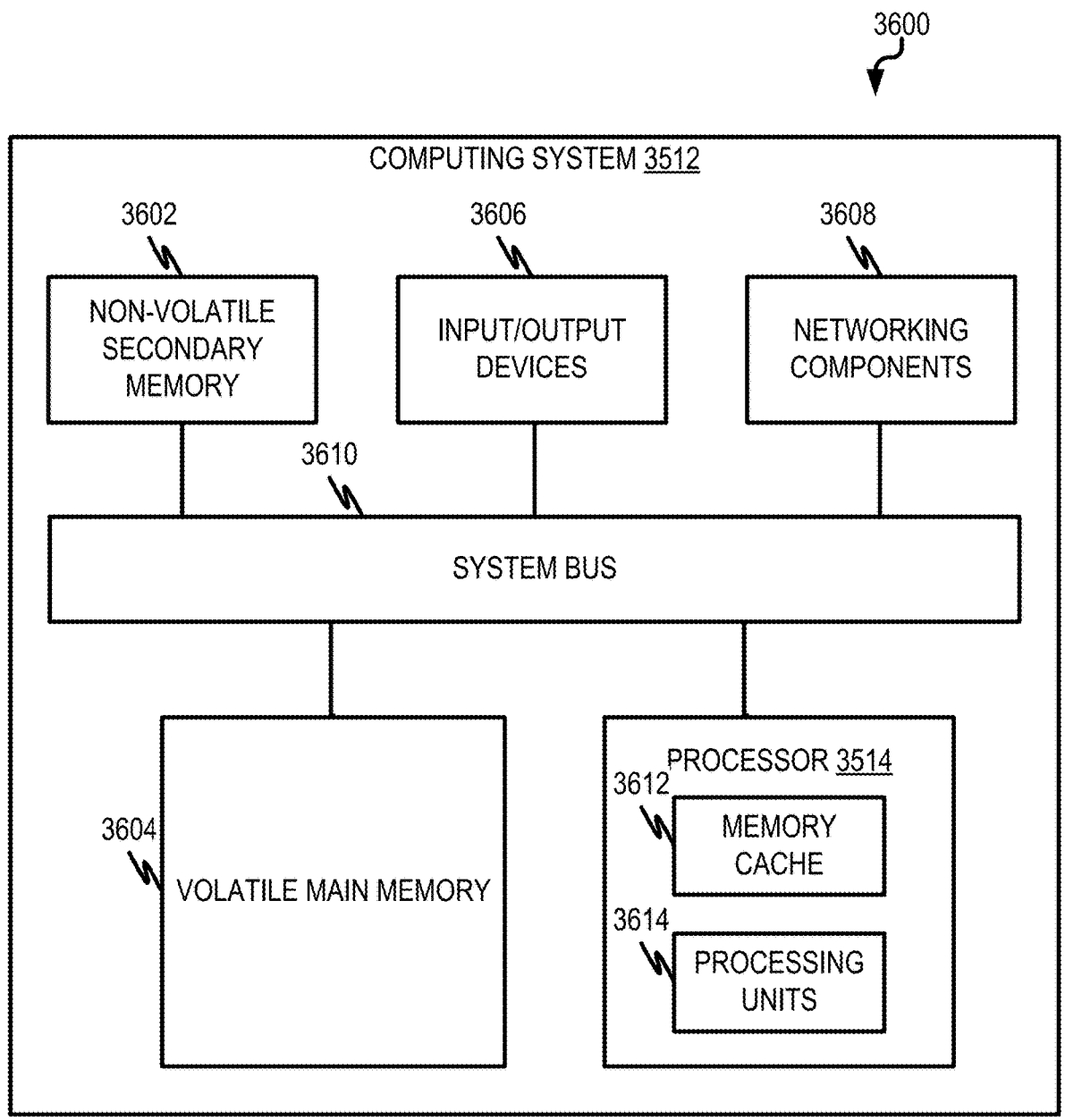
FIG. 36 depicts an example diagram showing a computing system for vector hysteresis analysis.

FIG. 36 depicts an example diagram showing a computing system 3600 for vector hysteresis analysis. As shown in FIG. 36, the computing system 3512 includes a processor 3514, memory devices 3602 and 3604, one or more input/output devices 3606, one or more networking components 3608, and a system bus 3610. The processor 3514 can include a memory case 3612 and/or one or more processing units 3614. In some embodiments, the computing system 3512 includes the vector hysteresis analysis module 3518, and provides access to the vector hysteresis analysis module 3518 to a user as a stand-alone computer.

This written description uses examples to disclose the invention, including the best mode, and also to enable a person skilled in the art to make and use the invention. The patentable scope of the invention may include other examples. For example, the systems and methods disclosed herein are configured to improve computational efficiency by using less play hysterons in a vector hysteresis model.

For example, the systems and methods may include data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of non-transitory computer-readable storage medium that is stored at a single location or distributed across multiple locations. The medium can include computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example, as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

The invention claimed is:

1. A method for analyzing magnetic hysteresis of an anisotropic magnetic material implemented by one or more data processors, the method comprising:
determining, by at least one data processor, a plurality of magnetic hysteresis loops associated with a local coordinate of a coordinate system based on a magnetic field successively applied to each principal axis of the anisotropic magnetic material;
determining, by at least one data processor, a relaxation factor associated with convergence behavior of a plurality of estimated solution points;
generating, by at least one data processor, a plurality of target points on the plurality of magnetic hysteresis loops by applying a first correction and the relaxation factor, wherein the first correction is a flux density correction or a magnetic field correction, wherein the first correction is applied using a first correction scheme;
determining, by at least one data processor, an error between the plurality of magnetic hysteresis loops and the plurality of estimated solution points;
repeating, by at least one data processor, the generating and determining the error up to a preset number of iterations;
applying, by at least one data processor, wherein the error is greater than an error threshold after the preset number of iterations, a second correction to the plurality of target points on the plurality of magnetic hysteresis loops, wherein the second correction is applied using a second correction scheme different from the first correction scheme; and
determining, by at least one data processor, a second error between the plurality of target points on the plurality of magnetic hysteresis loops with the second correction and the plurality of estimated solution points.

2. The method according to claim 1, wherein the first correction scheme is an H-correction scheme based on applied field intensity and the second correction scheme is a B-correction scheme based on applied flux density.

3. The method according to claim 1, further comprising:
repeating, by at least one data processor, the applying and determining until the second error is below the error threshold.

4. The method according to claim 1, wherein the relaxation factor is an under relaxation factor based on an unstable convergence behavior of the plurality of estimated solution points.

5. The method according to claim 4, wherein the relaxation factor is an over relaxation factor for stable convergence behaviors of the plurality of estimated solution points.

6. The method according to claim 1, wherein determining the plurality of magnetic hysteresis loops comprises:
applying an isotropic vector play model to each principal axis of the anisotropic magnetic material based on the magnetic field;
determining a flux density as a function of the magnetic field; or
determining the magnetic field as a function of the flux density; and
determining a permeability tensor and intercept corresponding to the anisotropic magnetic material.

7. The method according to claim 1, wherein the flux density correction is based on a minimum differential permeability.

8. The method according to claim 1, wherein the magnetic field correction is based on a maximum differential permeability.

9. The method according to claim 2, wherein the first correction is the flux density correction and the second correction is the magnetic field correction.

10. The method according to claim 2, wherein the first correction is the magnetic field correction and the second correction is the flux density correction.

11. The method according to claim 1, wherein the coordinate system is 2-dimensional or 3-dimensional.

12. The method according to claim 1, wherein the plurality of magnetic hysteresis loops are determined based on an analysis of a physical examination of an exemplary anistropic magnetic material and wherein a system incorporating the anistropic magnetic material is built or modified based on the analyzing.

13. The method according to claim 1, wherein the analyzing occurs in a simulation environment.

14. The method according to claim 1, wherein the plurality of magnetic hysteresis loops are determined based on a physical electrical system being modeled.

15. The method according to claim 1, further comprising providing, by at least one data processor, the error to a user via a graphical user interface for design modifications to a physical electrical system being modeled.

16. A system for analyzing magnetic hysteresis of a magnetic material, the system comprising:
   at least one data processor;
   memory storing instructions, which when executed by the at least one data processor, result in operations comprising:
      determining a plurality of magnetic hysteresis loops associated with a local coordinate of a coordinate system based on a magnetic field successively applied to each principal axis of the anisotropic magnetic material;
      determining a relaxation factor associated with convergence behavior of a plurality of estimated solution points;
      generating a plurality of target points on the plurality of magnetic hysteresis loops by applying a first correction and the relaxation factor, wherein the first correction is a flux density correction or a magnetic field correction;
      determining an error between the plurality of magnetic hysteresis loops and the plurality of estimated solution points;
      repeating the generating and determining the error up to a preset number of iterations;
      applying, wherein the error is greater than an error threshold after the preset number of iterations, a second correction to the plurality of target points on the plurality of magnetic hysteresis loops, wherein the second correction is applied using a second correction scheme different from the first correction scheme; and
      determining, by at least one data processor, a second error between the plurality of target points on the plurality of magnetic hysteresis loops with the second correction and the plurality of estimated solution points; and
   a non-transitory computer-readable storage medium configured to store data related to the plurality of target points and the plurality of estimation of solution points.

17. The system according to claim 16, wherein the first correction scheme is an H-correction scheme based on applied field intensity and the second correction scheme is a B-correction scheme based on applied flux density.

18. The system according to claim 16, wherein execution of the memory storing instructions results in operations further comprising:
   repeating the applying and determining until the second error is below the error threshold.

19. The system according to claim 16, wherein the relaxation factor is an under relaxation factor based on an unstable convergence behavior of the plurality of estimated solution points.

20. The system according to claim 19, wherein the relaxation factor is an over relaxation factor for stable convergence behaviors of the plurality of estimated solution points.

21. The system according to claim 16, wherein determining the plurality of magnetic hysteresis loops comprises:
   applying an isotropic vector play model to each principal axis of the anisotropic magnetic material based on the magnetic field;
   determining a flux density as a function of the magnetic field; or
   determining the magnetic field as a function of the flux density; and
   determining a permeability tensor and intercept corresponding to the anisotropic magnetic material.

22. The system according to claim 16, wherein the flux density correction is based on a minimum differential permeability.

23. The system according to claim 16, wherein the magnetic field correction is based on a maximum differential permeability.

24. The system according to claim 17, wherein the first correction is the flux density correction and the second correction is the magnetic field correction.

25. The system according to claim 17, wherein the first correction is the magnetic field correction and the second correction is the flux density correction.

26. The system according to claim 16, wherein the coordinate system is 2-dimensional or 3-dimensional.

27. The system according to claim 16, wherein the plurality of magnetic hysteresis loops are determined based on an analysis of a physical examination of an exemplary anistropic magnetic material and wherein a system incorporating the anistropic magnetic material is built or modified based on the analyzing.

28. The system according to claim 16, wherein the analyzing occurs in a simulation environment.

29. The system according to claim 16, wherein the plurality of magnetic hysteresis loops are determined based on a physical electrical system being modeled.

30. The system according to claim 16, wherein the operations further comprise providing, by at least one data processor, the error to a user via a graphical user interface for design modifications to a physical electrical system being modeled.

31. A non-transitory computer readable medium containing program instructions which, when executed by at least one data processor, result in operations comprising:
   determining a plurality of magnetic hysteresis loops associated with a local coordinate of a coordinate system based on a magnetic field successively applied to each principal axis of the anisotropic magnetic material;
   determining a relaxation factor associated with convergence behavior of a plurality of estimated solution points;
   generating a plurality of target points on the plurality of magnetic hysteresis loops by applying a first correction and the relaxation factor, wherein the first correction is a flux density correction or a magnetic field correction;
   determining an error between the plurality of magnetic hysteresis loops and the plurality of estimated solution points;
   repeating the generating and determining the error up to a preset number of iterations;
   applying, wherein the error is greater than an error threshold after the preset number of iterations, a second correction to the plurality of target points on the plurality of magnetic hysteresis loops, wherein the second correction is applied using a second correction scheme different from the first correction scheme; and determining a second error between the plurality of target points on the plurality of magnetic hysteresis loops with second correction and the plurality of estimated solution points.

32. The non-transitory computer readable medium according to claim 31, wherein the first correction scheme is an H-correction scheme based on applied field intensity and the second correction scheme is a B-correction scheme based on applied flux density.

33. The non-transitory computer readable medium according to claim 31, wherein execution of the computer instructions results in operations further comprising:
repeating the applying and determining until the second error is below the error threshold.

34. The non-transitory computer readable medium according to claim 32, wherein the relaxation factor is an under relaxation factor based on an unstable convergence behavior of the plurality of estimated solution points.

35. The non-transitory computer readable medium according to claim 34, wherein the relaxation factor is an over relaxation factor for stable convergence behaviors of the plurality of estimated solution points.

36. The non-transitory computer readable medium according to claim 31, wherein determining the plurality of magnetic hysteresis loops comprises:
applying an isotropic vector play model to each principal axis of the anisotropic magnetic material based on the magnetic field;
determining a flux density as a function of the magnetic field; or
determining the magnetic field as a function of the flux density; and
determining a permeability tensor and intercept corresponding to the anisotropic magnetic material.

37. The non-transitory computer readable medium according to claim 31, wherein the flux density correction is based on a minimum differential permeability.

38. The non-transitory computer readable medium according to claim 31, wherein the magnetic field correction is based on a maximum differential permeability.

39. The non-transitory computer readable medium according to claim 32, wherein the first correction is the flux density correction and the second correction is the magnetic field correction.

40. The non-transitory computer readable medium according to claim 32, wherein the first correction is the magnetic field correction and the second correction is the flux density correction.

41. The non-transitory computer readable medium according to claim 31, wherein the coordinate system is 2-dimensional or 3-dimensional.

42. The non-transitory computer readable medium according to claim 31, wherein the plurality of magnetic hysteresis loops are determined based on an analysis of a physical examination of an exemplary anistropic magnetic material and wherein a system incorporating the anistropic magnetic material is built or modified based on the analyzing.

43. The non-transitory computer readable medium according to claim 31, wherein the analyzing occurs in a simulation environment.

* * * * *